(12) United States Patent
Zhang et al.

(10) Patent No.: US 12,358,807 B2
(45) Date of Patent: Jul. 15, 2025

(54) QUANTUM DOT LIGHT EMITTING DEVICE AND MANUFACTURING METHOD THEREOF AS WELL AS DISPLAY APPARATUS

(71) Applicants: Beijing BOE Technology Development Co., Ltd., Beijing (CN); BOE Technology Group Co., Ltd., Beijing (CN)

(72) Inventors: Aidi Zhang, Beijing (CN); Yichi Zhang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 942 days.

(21) Appl. No.: 17/478,061

(22) Filed: Sep. 17, 2021

(65) Prior Publication Data

US 2022/0098051 A1 Mar. 31, 2022

(30) Foreign Application Priority Data

Sep. 30, 2020 (CN) .......................... 202011055725.2

(51) Int. Cl.
| | |
|---|---|
| *H10K 50/115* | (2023.01) |
| *C01G 9/02* | (2006.01) |
| *H10K 59/12* | (2023.01) |
| *H10K 59/122* | (2023.01) |
| *H10K 59/80* | (2023.01) |
| *B82Y 20/00* | (2011.01) |

(52) U.S. Cl.
CPC ............. *C01G 9/02* (2013.01); *H10K 50/115* (2023.02); *H10K 59/1201* (2023.02); *H10K 59/122* (2023.02); *H10K 59/873* (2023.02); *B82Y 20/00* (2013.01)

(58) Field of Classification Search
CPC ............. H10K 50/115; H10K 59/1201; H10K 59/122; H10K 59/873
See application file for complete search history.

(56) References Cited

U.S. PATENT DOCUMENTS

2019/0131587 A1* 5/2019 Chen ...................... H10K 50/13

\* cited by examiner

*Primary Examiner* — Daniel P Shook
(74) *Attorney, Agent, or Firm* — IPro, PLLC

(57) ABSTRACT

Disclosed are a quantum dot light emitting device and a manufacturing method thereof as well as a display apparatus. The quantum dot light emitting device includes: a substrate; a pixel definition layer, wherein the pixel definition layer includes a plurality of pixel openings and pixel partition bodies, and a surface of each pixel partition body has a hydroxide radical; a quantum dot layer, located in the pixel openings; and a polymer structure sealing the quantum dot layer in the pixel openings, wherein the polymer structure is a of fully enclosed structure at least formed by polymerization of siloxane, thiol siloxane and the hydroxide radical, the siloxane, the hydroxide radical and the thiol siloxane are all polymerized, and a sulfur atom of a thiol in the thiol siloxane is combined with a coordinating atom of the quantum dot layer.

8 Claims, 19 Drawing Sheets

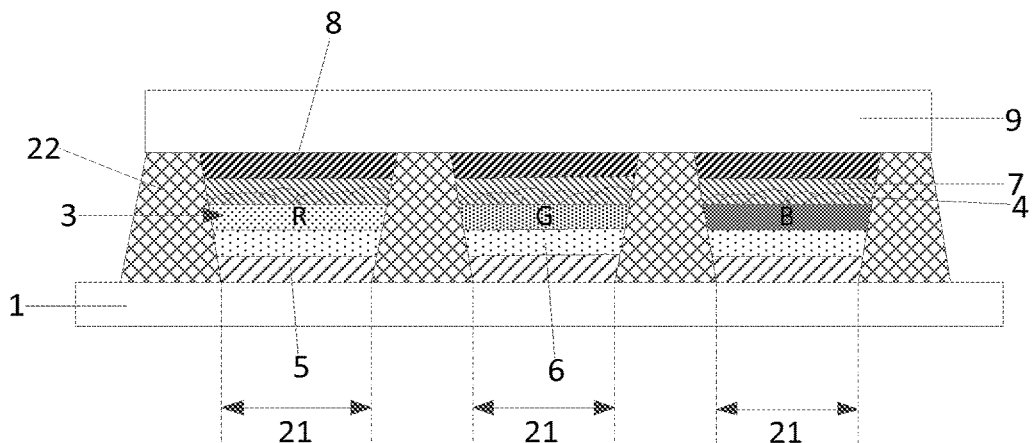

Fig. 7

| Forming a pixel definition layer on a substrate, wherein the pixel definition layer includes a plurality of pixel openings and pixel partition bodies, the pixel partition bodies define each of the plurality of pixel openings, and a surface of each pixel partition body has a hydroxide radical | S801 |

| Forming a quantum dot layer and a polymer structure sealing the quantum dot layer in the pixel openings respectively in the pixel openings | S802 |

Fig. 8

QUANTUM DOT LIGHT EMITTING DEVICE AND MANUFACTURING METHOD THEREOF AS WELL AS DISPLAY APPARATUS

CROSS-REFERENCE TO RELATED APPLICATION

This application is based on and claims priority under 35 U.S.C 119 to Chinese Patent Application No. 202011055725.2, filed on Sep. 30, 2020, in the China National Intellectual Property Administration. The entire disclosure of the above application is incorporated herein by reference.

FIELD

The present disclosure relates to the technical field of display, in particular to a quantum dot light emitting device and a manufacturing method thereof as well as a display apparatus.

BACKGROUND

Quantum dot light emitting diodes (QLEDs) have the advantages of high luminous intensity, good monochromaticity, high color saturation, and good stability. Therefore, the QLEDs have good application prospects in the display field.

SUMMARY

An embodiment of the present disclosure provides a quantum dot light emitting device, including:
  a substrate;
  a pixel definition layer arranged on the substrate, wherein the pixel definition layer includes a plurality of pixel openings and pixel partition bodies, the pixel partition bodies define each of the plurality of pixel openings, and a surface of each pixel partition body has a hydroxide radical;
  a quantum dot layer arranged in the pixel openings; and
  a polymer structure sealing the quantum dot layer in the pixel openings, wherein the polymer structure is of a fully enclosed structure at least formed by polymerization of siloxane, thiol siloxane and the hydroxide radical, the siloxane, the hydroxide radical and the thiol siloxane are all polymerized, and a sulfur atom of a thiol in the thiol siloxane is combined with a coordinating atom of the quantum dot layer.

Optionally, in the quantum dot light emitting device provided by an embodiment of the present disclosure, the thiol in the thiol siloxane has disulfide reaction to form the polymer structure, and the polymer structure is —O—$(SiO_2)_{m+1}$—R—S—S—R—$(SiO2)_{m+1}$—O—, where R is an alkyl radical.

Optionally, in the quantum dot light emitting device provided by an embodiment of the present disclosure, the thiol in the thiol siloxane has addition reaction with an olefin to form the polymer structure, and each polymer structure is —O—$(SiO_2)_{m+1}$—R—S—CR1-CR2-S—R—$(SiO2)_{m+1}$—O—, wherein
  R is an alkyl radical, R1 and R2 are respectively selected from one or more of polyphenylene, polythiophene, polyfluorene, polytriphenylamine, polycarbazole, polypyrrole, and polyporphyrin, and R1 and R2 are identical or different.

Optionally, in the quantum dot light emitting device provided by an embodiment of the present disclosure, m is 1-25.

Optionally, in the quantum dot light emitting device provided by an embodiment of the present disclosure, the quantum dot layer includes a red quantum dot, a blue quantum dot and a green quantum dot, and a surface of each of the red quantum dot, the blue quantum dot and the green quantum dot has a corresponding polymer structure.

Optionally, in the quantum dot light emitting device provided by an embodiment of the present disclosure, the quantum dot light emitting device further includes: a cathode between the substrate and the quantum dot layer, an electron transport layer between the cathode and the quantum dot layer, a hole transport layer arranged on a side of the polymer structure facing away from the substrate, a hole injection layer arranged on a side of the hole transport layer facing away from the substrate, and an anode arranged on a side of the hole injection layer facing away from the substrate.

Correspondingly, an embodiment of the present disclosure further provides a display apparatus, including the quantum dot light emitting device provided by some embodiments of the present disclosure.

Correspondingly, an embodiment of the present disclosure further provides a manufacturing method of a quantum dot light emitting device, including:
  forming a pixel definition layer on a substrate, wherein the pixel definition layer includes a plurality of pixel openings and pixel partition bodies, the pixel partition bodies define each of the plurality of pixel openings, and a surface of each pixel partition body has a hydroxide radical; and
  forming a quantum dot layer and a polymer structure sealing the quantum dot layer in the pixel openings respectively in the pixel openings, wherein the polymer structure is of a fully enclosed structure at least formed by polymerization of siloxane, thiol siloxane and the hydroxide radical, the siloxane, the hydroxide radical and the thiol siloxane are all polymerized, and a sulfur atom of a thiol in the thiol siloxane is combined with a coordinating atom of the quantum dot layer; and
  a monochromatic quantum dot layer and the polymer structure is formed by:
  forming a sacrifice layer in a region outside a target pixel opening;
  spin-coating the substrate on which the sacrifice layer is formed with a monochromatic quantum dot material;
  forming the polymer structure in the target pixel opening; and
  removing the sacrifice layer to form the monochromatic quantum dot layer in the target pixel opening.

Optionally, in the manufacturing method provided by an embodiment of the present disclosure, the forming the sacrifice layer in the region outside the target pixel opening includes:
  spin-coating the substrate with a sacrifice layer material film layer;
  coating a photoresist layer on a side of the sacrifice layer material film layer facing away from the substrate;
  developing the photoresist layer by exposure to remove a photoresist material in the target pixel opening; and
  removing a sacrifice layer material in the target pixel opening to form the sacrifice layer in the region outside the target pixel opening.

Optionally, in the manufacturing method provided by an embodiment of the present disclosure, the forming the polymer structure in the target pixel opening includes:

adopting a siloxane reagent for reaction with the hydroxide radical on the pixel partition bodies to obtain a siloxane polymer —O—(SiO2)$_m$;

adopting a thiol siloxane reagent for reaction with the siloxane polymer —O—(SiO2)$_m$ to obtain a thiol siloxane polymer —O—(SiO2)$_{m+1}$—R—SH, where R is an alkyl radical; and making a reaction between adjacent thiol siloxane polymer —O—(SiO2)$_{m+1}$—R—SH to form the polymer structure.

Optionally, in the manufacturing method provided by an embodiment of the present disclosure, the making a reaction between the adjacent thiol siloxane polymer —O—(SiO2)$_{m+1}$—R—SH to form the polymer structure includes:

making —SH in the adjacent —O—(SiO2)$_{m+1}$—R—SH on the pixel partition bodies around the target pixel opening to have disulfide reaction to form each —O—(SiO2)$_{m+1}$—R—S—S—R—(SiO2)$_{m+1}$—O— polymer structure.

Optionally, in the manufacturing method provided by an embodiment of the present disclosure, making a reaction between the adjacent —O—(SiO2)$_{m+1}$—R—SH to form the polymer structure includes:

introducing an R1CH=CHR2 olefin compound into the —O—(SiO2)$_{m+1}$—R—SH on the pixel partition bodies around the target pixel opening, and making the adjacent —O—(SiO2)$_{m+1}$—R—SH and the R1CH=CHR2 to have addition reaction to form a —O—(SiO2)$_{m+1}$—R—S—CR1-CR2-S—R—(SiO2)$_{m+1}$—O— polymer structure, where R1 and R2 are respectively selected from one or more of polyphenylene, polythiophene, polyfluorene, polytriphenylamine, polycarbazole, polypyrrole, and polyporphyrin, and R1 and R2 are identical or different.

Optionally, in the manufacturing method provided by an embodiment of the present disclosure, the removing the sacrifice layer to form the monochromatic quantum dot layer in the target pixel opening includes:

placing the substrate formed with the polymer structure in an alcohol solvent and ultrasonicating for 1 min-10 min to dissolve the sacrificial layer to remove the sacrificial layer and peel off remaining photoresist layer; and removing remaining solvent at a temperature of 50-120° C. to form the monochromatic quantum dot layer and the polymer structure.

BRIEF DESCRIPTION OF THE DRAWINGS

FIG. 7 is a schematic structural diagram of another quantum dot light emitting device provided by an embodiment of the present disclosure;

FIG. 8 is a first manufacturing method flow chart of a method for patterning a quantum dot layer provided by an embodiment of the present disclosure;

DETAILED DESCRIPTION OF THE EMBODIMENTS

In order to make the objectives, technical solutions and advantages of the present disclosure clearer, specific implementations of a quantum dot light emitting device and a manufacturing method thereof, as well as a display apparatus provided by embodiments of the present disclosure will be described in detail below with reference to the accompanying drawings.

The thickness and shape of each layer of film in the accompanying drawings do not reflect the true proportions of the quantum dot light emitting device, but are only to illustrate the content of the present disclosure schematically.

At present, in the manufacturing process of full-color QLED devices, a "lift-off" process based on "photolithography technology+macromolecule sacrificial layer" may realize patterning of quantum dots. However, quantum dots of different colors are formed by etching in steps, and each color of quantum dots needs to undergo development, which causes the quantum dots to undergo a variety of processes (such as immersion in a paraxylene developer, immersion in an ethanol and other polar solvents or ultrasound, etc.) and will cause a quantum dot layer to fall off or be thinned and will affect device performance.

Figure 1:
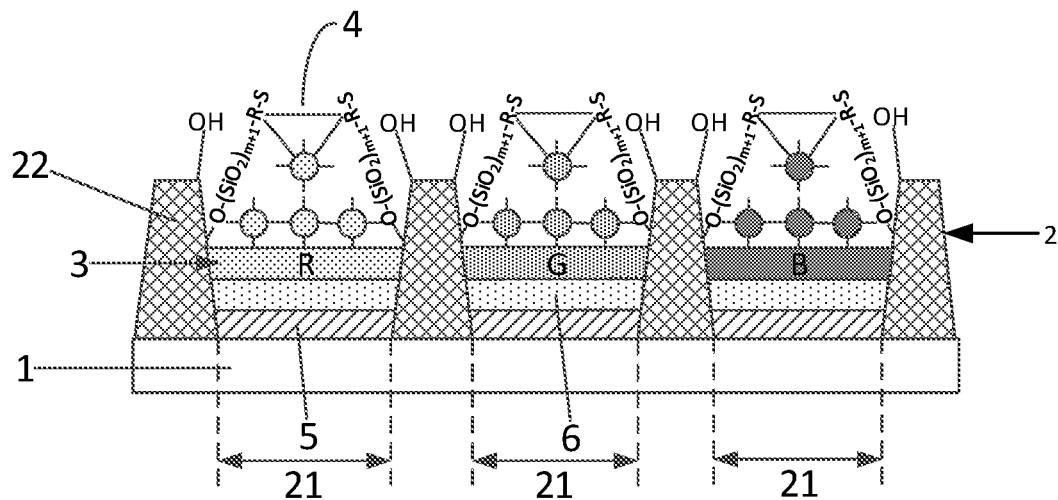
FIG. 1 is a schematic structural diagram of a quantum dot light emitting device provided by an embodiment of the present disclosure.
Figure 2:
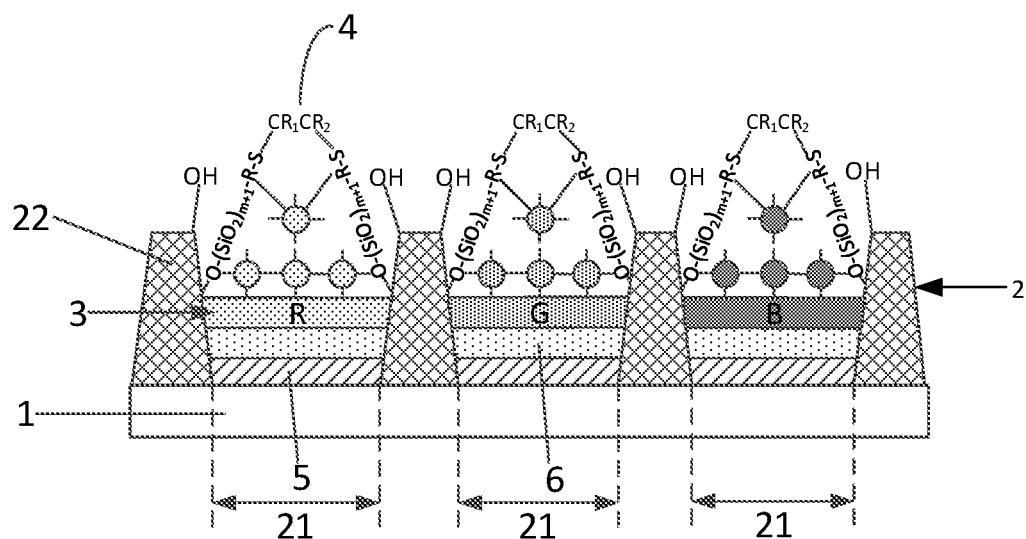
FIG. 2 is a top view corresponding to FIG. 1.
Figure 3:
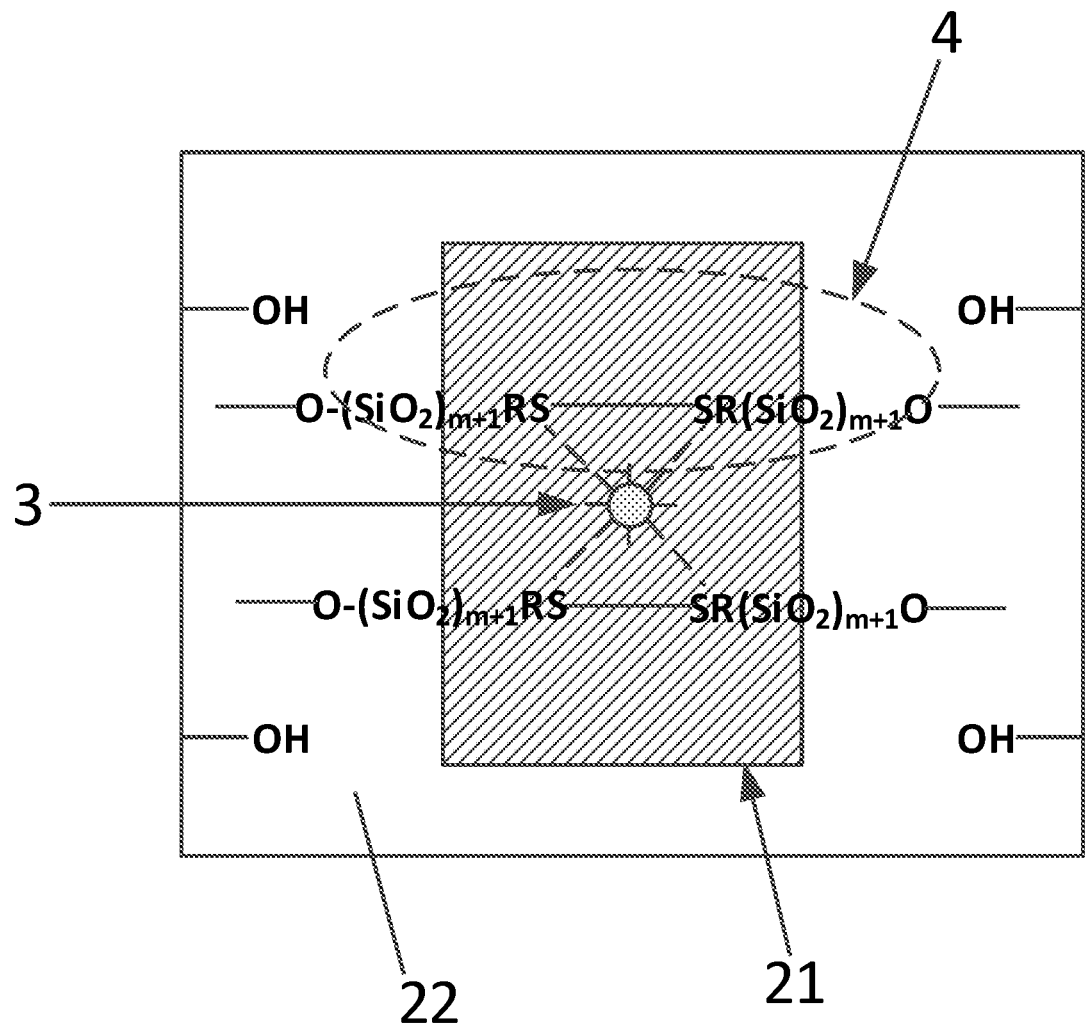
FIG. 3 is a schematic structural diagram of another quantum dot light emitting device provided by an embodiment of the present disclosure.
Figure 4:
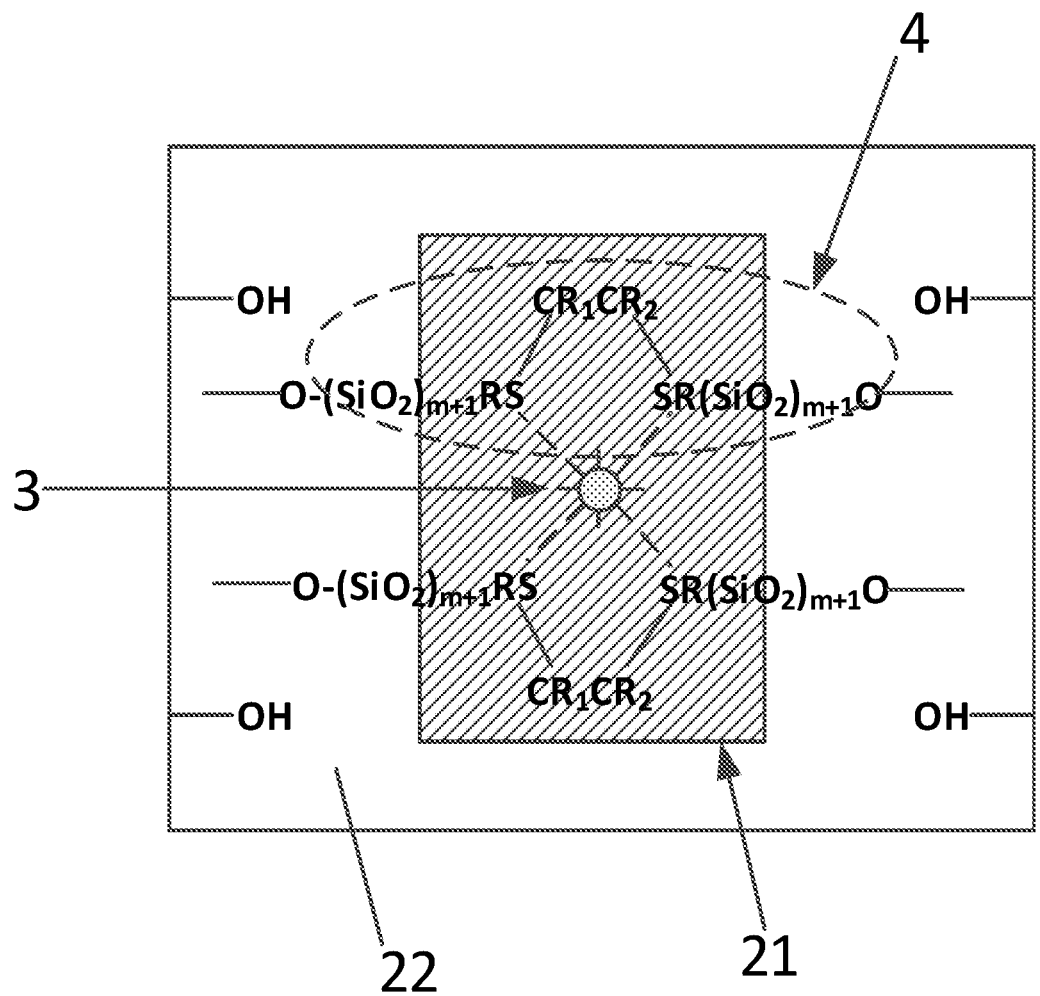
FIG. 4 is a top view corresponding to FIG. 3.

On this account, an embodiment of the present disclosure provides a quantum dot light emitting device, as shown in FIGS. 1-4. FIG. 1 and FIG. 3 are sectional schematic structural diagrams of the quantum dot light emitting device, FIG. 2 is a top view corresponding to FIG. 1, and FIG. 4 is a top view corresponding to FIG. 3. The quantum dot light emitting device includes:

a substrate 1;

a pixel definition layer 2, located on the substrate 1, wherein the pixel definition layer 2 includes a plurality of pixel openings 21 and pixel partition bodies 22, the pixel partition bodies 22 define each of the plurality of pixel openings 21, and a surface of each pixel partition body 22 has a hydroxide radical (—OH);

quantum dot layers 3, located in the pixel openings 21; and polymer structures 4, sealing the quantum dot layers 3 in the pixel openings 21, wherein a sulfur atom of a thiol in the thiol siloxane is combined with a coordinating atom of each quantum dot layer.

According to the quantum dot light emitting device provided by an embodiment of the present disclosure, the polymer structures sealing the quantum dot layers in the pixel openings are formed on the quantum dot layers, and the polymer structures are of the fully enclosed structures, so that the quantum dot layers can be protected against solvent damage during a subsequent photoresist development process, a film thickness of each quantum dot layer is kept unchanged, a quantum dot layer ligand is protected against loss, and device performance is improved.

Further, the arrangement of the polymer structures in the present disclosure may prevent quantum dots from being lost in a specific process, so that each quantum dot layer always maintains a certain thickness, and an electron and hole recombination region may always be maintained in each quantum dot layer.

In specific implementation, siloxane may be selected from: tetraethyl orthosilicate, methyl orthosilicate, ethyl orthosilicate, diphenyldimethoxysilane, hexadecyltrimethoxysilane, isobutyl Triethoxy silane, isobutyl trimethoxy silane, dimethyl dimethoxy silane, methyl ketoxime silane, methyl triacetoxy silane, propyl triethoxy isocyanate Silicon, phenyltrimethoxysilane, phenyltriethoxysilane, octyltrimethoxysilane, n-octyltriethoxysilane, dodecyltriethoxysilane, dodecyltrimethoxysilane ailane, vinyl tributyl ketoxime silane, etc.

In specific implementation, the thiol siloxane may be selected from:

3-mercaptopropyltrimethoxysilane, 3-mercaptopropyltriethoxysilane, 3-mercaptopropylmethyldimethoxysilane, 3-mercapto propylmethyldiethoxysilane, mercaptopropylsilane, 3-mercaptopropyltrimethylsilane, bis-[3-(triethoxysilyl)propyl]-tetrasulfide and other thiol-containing silanes.

In specific implementation, a surface of each quantum dot layer has defective sites or regions not covered by ligands, so as to chemically coordinate with an S atom introduced into each polymer structure. Oil-soluble cadmium-containing quantum dots, such as CdS/ZnS, CdSe/ZnS, CdSe/ZnSeS, and CdSe/CdS, as well as oil-soluble cadmium-free quantum dots, such as ZnSe/ZnS, InP/ZnS, CuInS/ZnS, (Zn)CuInS/ZnS, (Mn)CuInS/ZnS, AgInS/ZnS, (Zn)AgInS/ZnS, CuInSe/ZnS, and CuInSeS/ZnS, may be selected.

In specific implementation, in the quantum dot light emitting device provided by an embodiment of the present disclosure, as shown in FIG. 1, a thiol (—SH) in the thiol siloxane has disulfide reaction to form each polymer structure 4, and each polymer structure 4 is —O—$(SiO_2)_{m+1}$—R—S—S—R—$(SiO_2)_{m+1}$—O—, where R is an alkyl radical.

Figure 5A:
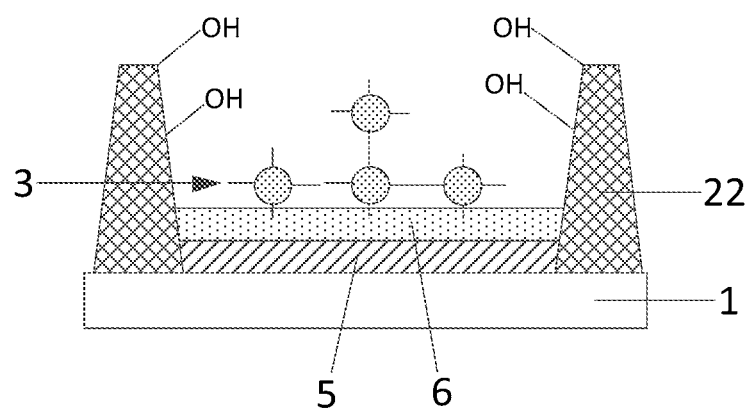
FIG. 5A is a schematic structural diagram of manufactured quantum dot layers during formation of a polymer structure.
Figure 5B:
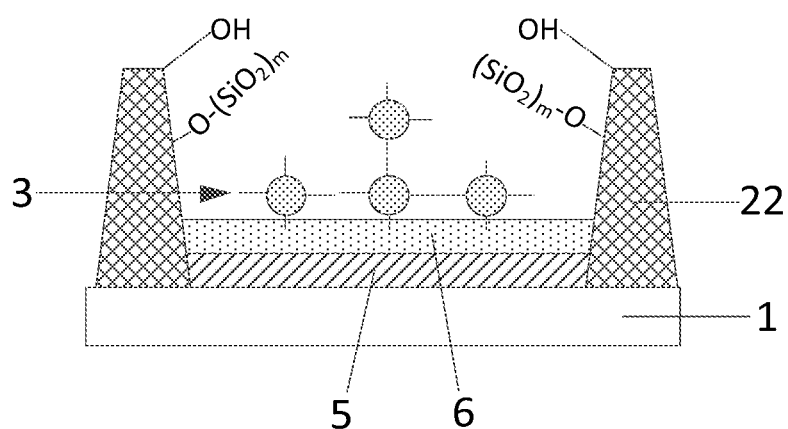
FIG. 5B is a schematic structural diagram of a siloxane polymer —O—(SiO$_2$)$_m$ obtained by reacting with the hydroxyl radical —OH on each pixel partition body around the first target pixel opening during formation of a polymer structure.
Figure 5C:
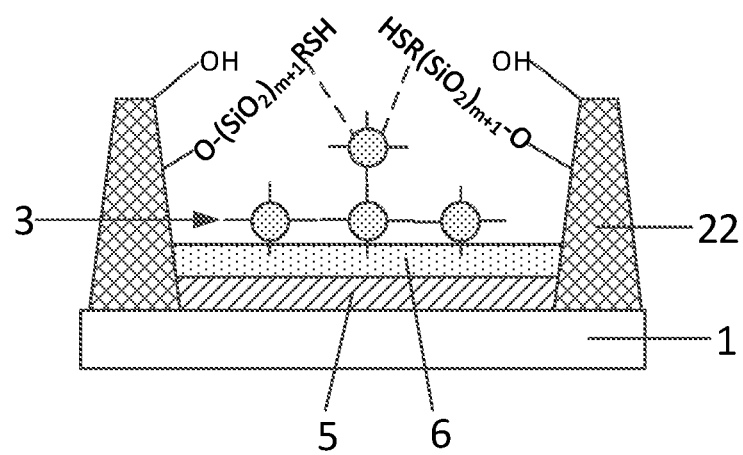
FIG. 5C is a schematic structural diagram of the thiol siloxane polymer obtained by reacting the thiol siloxane reagent with the siloxane polymer of FIG. 5B.
Figure 5D:
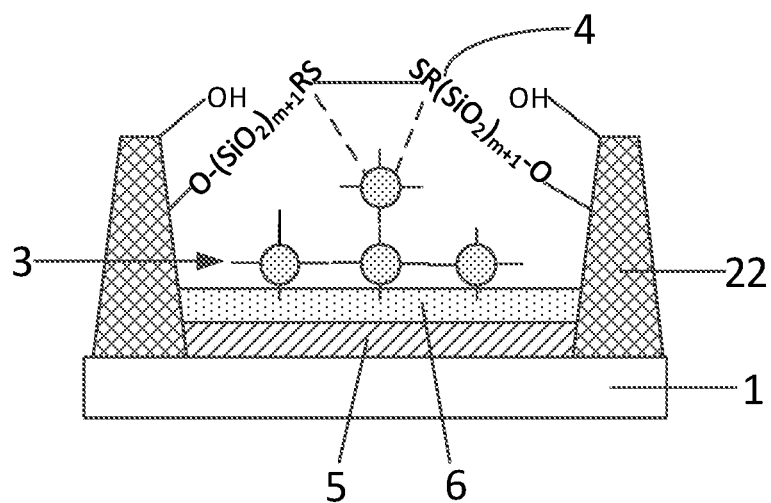
FIG. 5D is a schematic structural diagram of a polymer structure formed by disulfide reaction of —SH in the thiol siloxane.

Optionally, description is made on a principle of a structure forming each polymer structure 4 as shown in FIG. 1: as shown in FIG. 5A, FIG. 5A is a schematic diagram of manufacturing the quantum dot layers 3; as shown in FIG. 5B, —OH on each pixel partition body 22 is modified with siloxane to obtain a siloxane polymer (—O—$(SiO_2)_m$); as shown in FIG. 5C, the siloxane polymer in FIG. 5B is modified with thiol siloxane and a —O—$(SiO_2)_{m+1}$—R—SH structure is obtained; and as shown in FIG. 5D, the thiol (—SH) in the thiol siloxane has disulfide reaction (i.e. —SH functional group having dehydrogenation reaction) to form each polymer structure 4, and each polymer structure 4 is —O—$(SiO_2)_{m+1}$—R—S—S—R—$(SiO_2)_{m+1}$—O—.

In specific implementation, in the quantum dot light emitting device provided by an embodiment of the present disclosure, as shown in FIG. 2, the thiol (—SH) in the thiol siloxane has addition reaction with an olefin to form each polymer structure, and each polymer structure is —O—$(SiO_2)_{m+1}$—R—S—$CR_1$—$CR_2$—S—R—$(SiO_2)_{m+1}$—O—.

Optionally, R may be methyl, ethyl, propyl, pentyl, hexyl, octyl, nonyl, dodecyl, or tetradecyl.

Figure 5E:
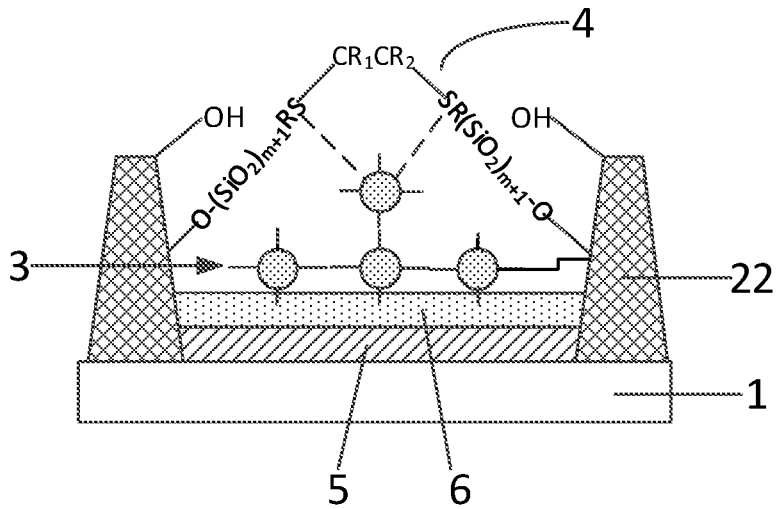
FIG. 5E is a schematic structural diagram of a sulfur-containing cross-linked polymer structure —O—(SiO$_2$)$_{m+1}$—R—S—CR$_1$—CR$_2$—S—R—(SiO$_2$)$_{m+1}$—O—, generated by introducing an olefin compound of an R$_1$CH=CHR$_2$ structure, and performing click chemistry addition reaction on a basis of introducing a —O—(SiO$_2$)$_{m+1}$—R—SH functional group on each pixel partition body 22, during formation of a polymer structure.
Figure 6:
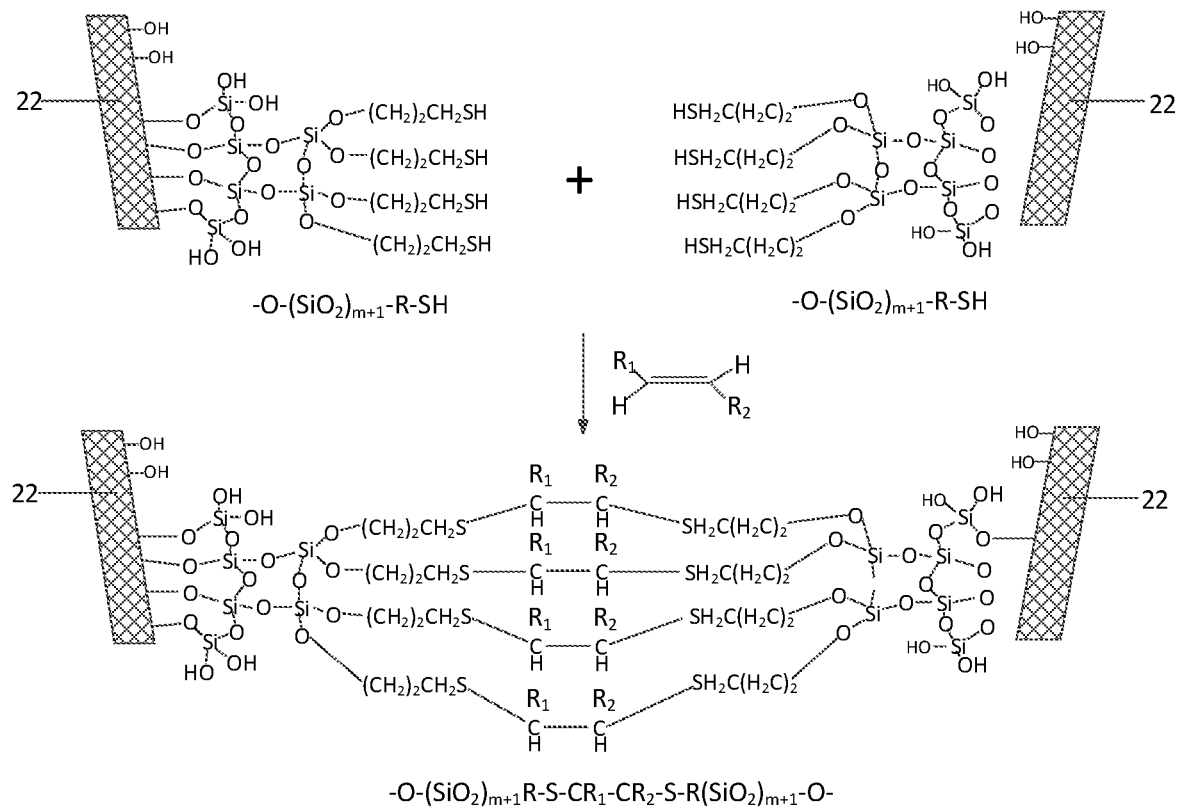
FIG. 6 is a schematic structural diagram of a principle of forming a polymer structure.

Optionally, description is made on a principle of a structure forming each polymer structure 4 as shown in FIG. 2: steps for obtaining the —O—$(SiO_2)_{m+1}$—R—SH are the same as FIGS. 5A-5C; and after FIG. 5C, as shown in FIG. 5E, on a basis of introducing a —O—$(SiO_2)_{m+1}$—R—SH functional group on each pixel partition body 22, an olefin compound of an $R_1CH$=$CHR_2$ structure (which may be a carbon-carbon double bond or a derivative of a carbon-carbon double bond structure) is introduced, and click chemistry addition reaction is performed to generate a sulfur-containing cross-linked polymer structure —O—$(SiO_2)_{m+1}$—R—S—$CR_1$—$CR_2$—S—R—$(SiO_2)_{m+1}$—O—. Optionally, as shown in FIG. 6, FIG. 6 is a schematic diagram that —O—$(SiO_2)_m$—SH on two sides of each pixel partition body 22 in a structure shown in FIG. 13E has click chemistry addition reaction with the $R_1CH$=$CHR_2$ compound, and the olefin has addition reaction with the adjacent thiol, so as to form the fully enclosed polymer structure —O—$(SiO_2)_{m+1}$—R—S—$CR_1$—$CR_2$—S—R—$(SiO_2)_{m+1}$—O—.

Optionally, an "organic hole transport layer/quantum dot/inorganic electron transport layer" hybrid QLED device structure that is commonly adopted at present has the problems of insufficient hole transport ability injection and imbalance of electrons and holes. In the embodiment of the present disclosure, the insufficient hole transport ability may also be realized by R1 and R2 groups in the polymer structures 4 in FIG. 2. The R1 and R2 groups may be selected from functional groups such as polyphenylene, polythiophene, polyfluorene, polytriphenylamine, polycarbazole, polypyrrole, and polyporphyrin. These functional groups have hole transport ability, and form a new hole transport path with the quantum dot layers 3 to improve the hole transport ability and regulate the balance of carrier injection.

It should be noted that in the structure shown in FIG. 2 of the embodiment of the present disclosure, the thiol (—SH) in the thiol siloxane has addition reaction with the olefin (with a —CR1=CR2- structure) to form the polymer structures. Of course, the thiol (—SH) in the thiol siloxane may have addition reaction with an alkyne (with a —C≡C— structure) to form the polymer structures.

In specific implementation, in the quantum dot light emitting device provided by an embodiment of the present disclosure, as shown in FIGS. 1 and 2, m is a positive integer and may be 1-25.

In specific implementation, in the quantum dot light emitting device provided by an embodiment of the present disclosure, as shown in FIGS. 1 and 2, each quantum dot layer 3 includes a red quantum dot (R), a green quantum dot (G) and a blue quantum dot (B), and a surface of each quantum dot of each color has a corresponding polymer structure. In this way, each quantum dot of each color may be prevented from solvent damage, a film thickness of each quantum dot layer is kept unchanged, a quantum dot layer ligand is protected against loss, and device performance is further improved.

In particular, a patterning sequence of each quantum dot of each color may be adjusted according to actual situation, and all patterned quantum dots are covered with the fully enclosed polymer structures.

Electroluminescent devices generally include upright structure devices and inverted structure devices. In the inverted structure devices, a zinc oxide film is used as a substrate. The zinc oxide substrate is a dense inorganic oxide film, which is relatively stable and may withstand various patterning process treatment (resistant to etching or soaking in various solvents). Therefore, in specific implementation, in the quantum dot light emitting device provided by an embodiment of the present disclosure, as shown in FIGS. 1, 2 and 7, the quantum dot light emitting device further includes: a cathode 5 located between the substrate 1 and each quantum dot layer 3, an electron transport layer 6 located between the cathode 5 and each quantum dot layer 3, a hole transport layer 7 located on a side of each polymer structure 4 facing away from the substrate 1, a hole injection layer 8 located on a side of the hole transport layer 7 facing away from the substrate 1, and an anode 9 located on a side of the hole injection layer 8 facing away from the substrate 1. That is, the embodiment of the present disclosure preferably adopts an inverted structure device, and of course, it may also be an upright structure device. The difference between the upright structure device and the inverted structure device lies in that manufacturing sequences of the cathode 5, the electron transport layer 6, the quantum dot layers 3, the hole transport layer 7, the hole injection layer 8 and the anode 9 on the substrate 1 are reversed.

It should be noted that a principle of light emission of the electroluminescent devices is: holes of the anode and electrons of the cathode are transported to a light emitting layer (quantum dot layer) to emit light, due to a difference of energy barriers between the anode and the light emitting layer and between the cathode and the light emitting layer, transmission between the electrons and the holes is difficult and a transmission rate and quantity are also very different. Therefore, in order to balance a concentration of the electrons and the holes, a hole injection layer, a hole transport layer and an electron blocking layer are generally arranged between the light emitting layer (quantum dot layer) and the anode, an electron injection layer, an electron transport layer and a hole blocking layer are arranged between the light emitting layer (quantum dot layer) and the cathode. Of course, in specific implementation, the layers may be selected according to actual needs.

Based on the same inventive concept, an embodiment of the present disclosure further provides a manufacturing method of the quantum dot light emitting device. As shown in FIG. 8, the manufacturing method includes followings.

S801, a pixel definition layer is formed on a substrate, wherein the pixel definition layer includes a plurality of pixel openings and pixel partition bodies, the pixel partition bodies define each of the plurality of pixel openings, and a surface of each pixel partition body has a hydroxide radical.

Figure 13A:
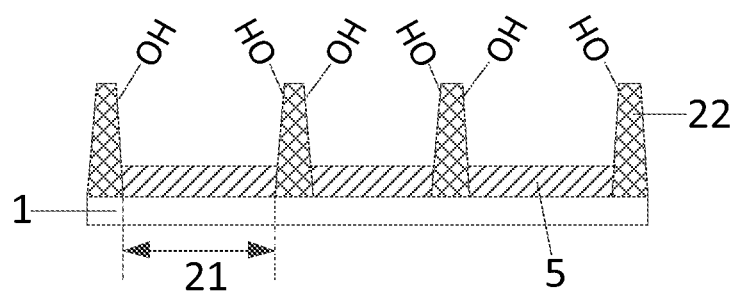
FIG. 13A is a schematic structural diagram after executing each step in the manufacturing method of the quantum dot light emitting device provided by embodiments of the present disclosure.

Optionally, conductive glass is ultrasonically cleaned with isopropanol, water, and acetone, and treated with a ultraviolet cleaning machine for 3-20 min to eliminate dust and organic matters on a surface of the conductive glass. Specific requirements are raised on the conductive glass: the conductive glass is a TFT driving backplane with a thin film transistor structure. The TFT driving backplane is the substrate 1 of the present disclosure. Then, the cathode 5 is formed on the substrate 1, and the pixel defining layer 2 having the plurality of pixel openings 21 and the pixel partition bodies 22 is formed; and a material of the pixel partition bodies 22 is usually a macromolecular polymer containing a hydroxyl radical such as polyethylene glycol, polyvinyl acetate, cellulose or chitosan (molecular weight>5000), or non-metallic silicon-containing oxides, such as silicon dioxide, silicon oxynitride, etc., as shown in FIG. 13A.

S802, the quantum dot layers and the polymer structures sealing the quantum dot layers in the pixel openings are sequentially formed in the pixel openings, wherein each polymer structure is of a fully enclosed structure at least formed by polymerization of siloxane, thiol siloxane and the hydroxide radical, the siloxane, the hydroxide radical and the thiol siloxane are all polymerized, and a sulfur atom of a thiol in the thiol siloxane is combined with a coordinating atom of each quantum dot layer.

Figure 13B:
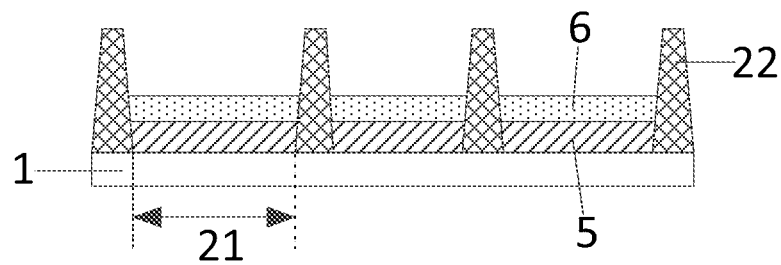
FIG. 13B is a schematic structural diagram after forming an electron transport layer in the pixel opening of the substrate during formation of red quantum dot and polymer structure thereof.
Figure 13C:
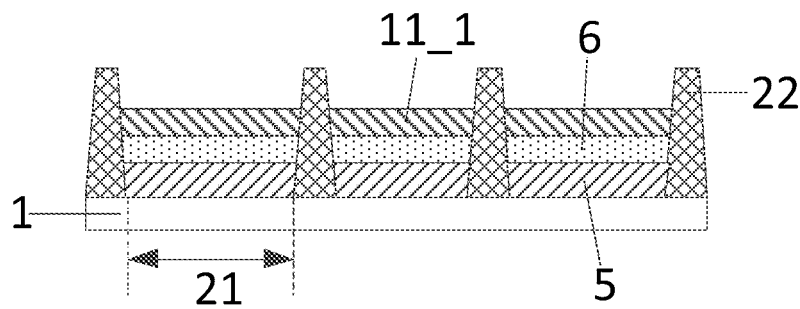
FIG. 13C is a schematic structural diagram after spin-coating the electron transport layer with the sacrifice layer material film layer during formation of red quantum dot and polymer structure thereof.
Figure 13D:
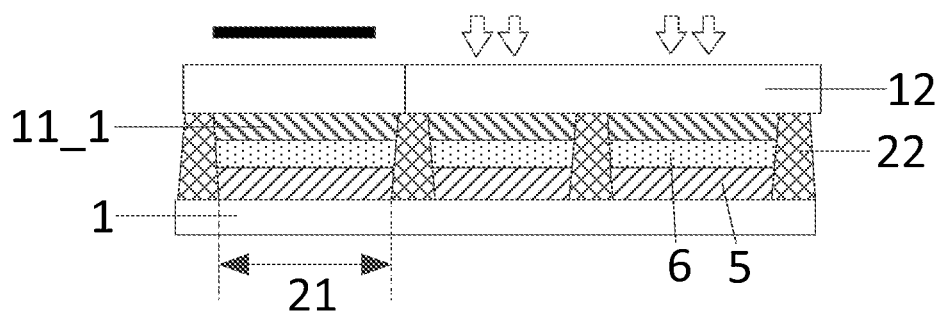
FIG. 13D is a schematic structural diagram after forming a photoresist layer on the electron transport layer during formation of red quantum dot and polymer structure thereof.
Figure 13E:
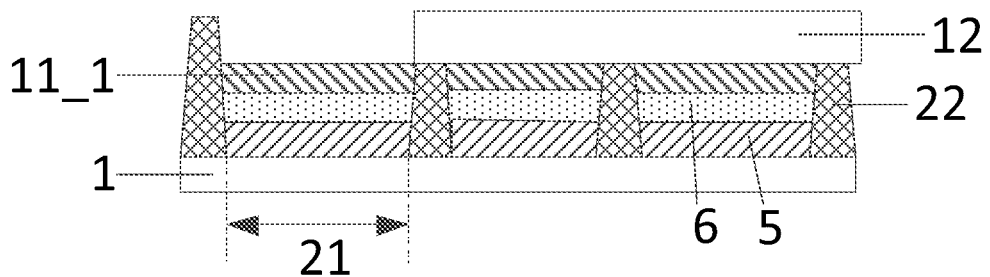
FIG. 13E is a schematic structural diagram after removing the photoresist material in the first target pixel opening during formation of red quantum dot and polymer structure thereof.
Figure 13F:
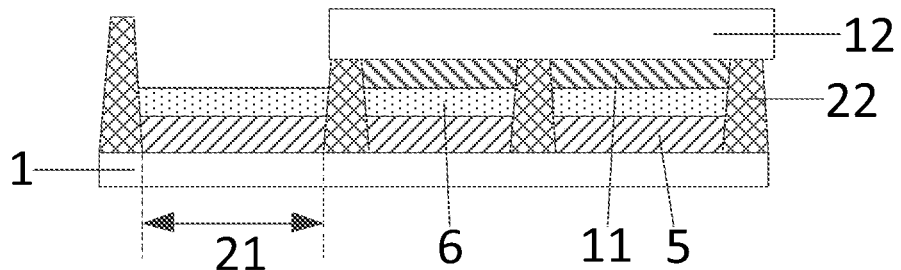
FIG. 13F is a schematic structural diagram after forming a sacrifice layer in a region outside the target pixel opening during formation of red quantum dot and polymer structure thereof.
Figure 13G:
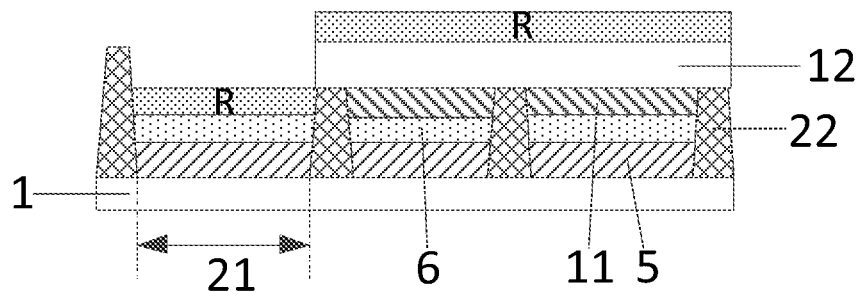
FIG. 13G is a schematic structural diagram after spin-coating the substrate of the sacrifice layer with the monochromatic quantum dot material during formation of red quantum dot and polymer structure thereof.
Figure 13H:
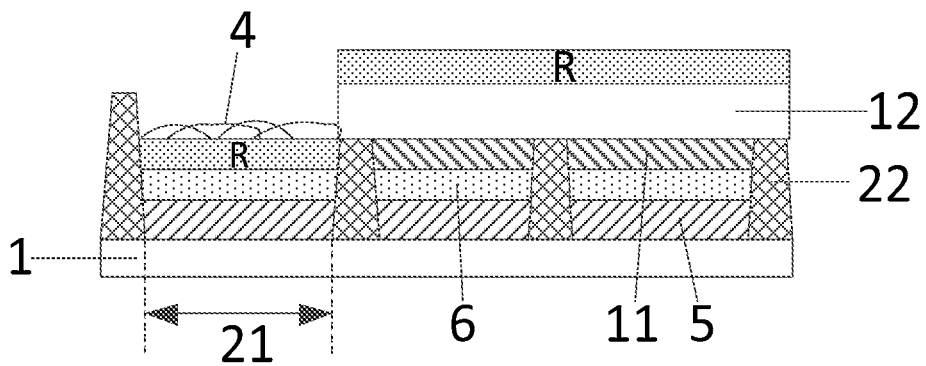
FIG. 13H is a schematic structural diagram after forming the polymer structure in a first target pixel opening during formation of red quantum dot and polymer structure thereof.
Figure 13I:
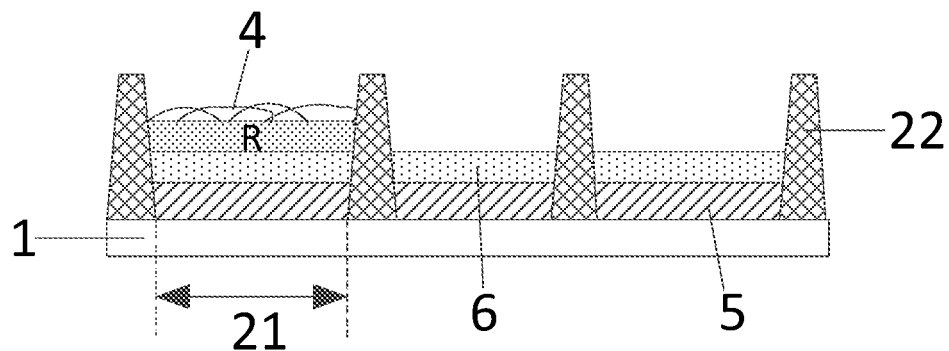
FIG. 13I is a schematic structural diagram after removing the sacrifice layer to form the monochromatic quantum dots in the first target pixel opening during formation of red quantum dot and polymer structure thereof.
Figure 13J:
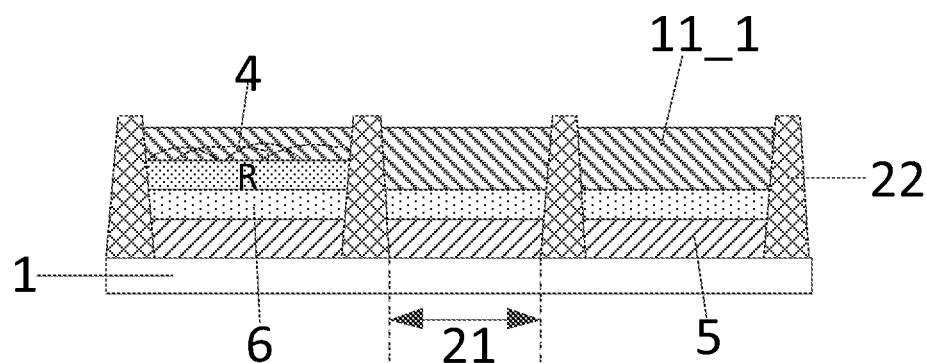
FIG. 13J is a schematic structural diagram after spin-coating the electron transport layer with the sacrifice layer material film layer during formation of green quantum dot and polymer structure thereof.
Figure 13K:
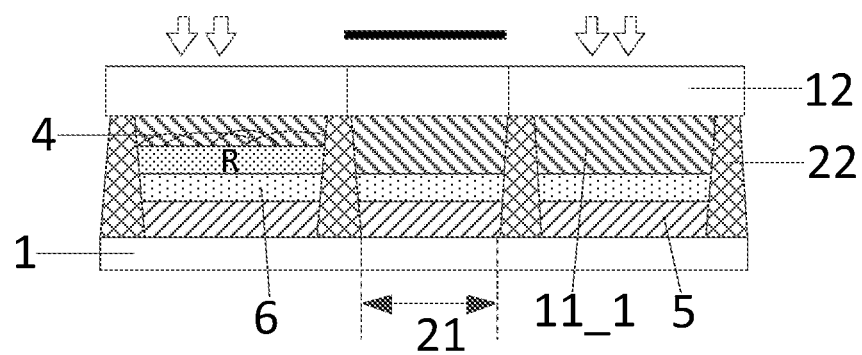
FIG. 13K is a schematic structural diagram after forming a photoresist layer on the electron transport layer during formation of green quantum dot and polymer structure thereof.
Figure 13L:
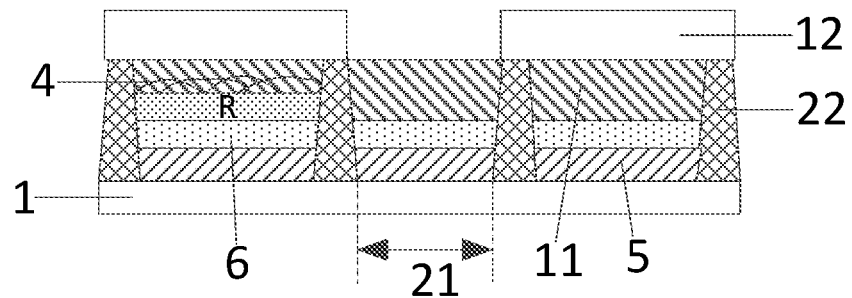
FIG. 13L is a schematic structural diagram after removing the photoresist material in the first target pixel opening during formation of green quantum dot and polymer structure thereof.
Figure 13M:
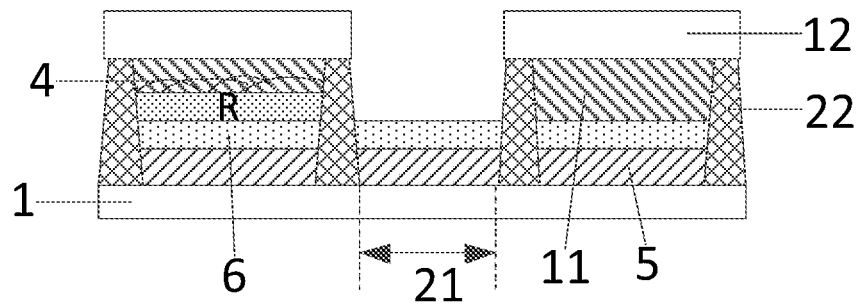
FIG. 13M is a schematic structural diagram after forming a sacrifice layer in a region outside the target pixel opening during formation of green quantum dot and polymer structure thereof.
Figure 13N:
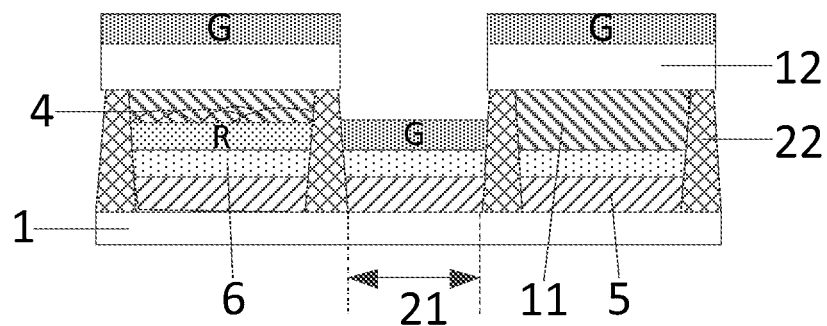
FIG. 13N is a schematic structural diagram after spin-coating the substrate of the sacrifice layer with the monochromatic quantum dot material during formation of green quantum dot and polymer structure thereof.
Figure 13O:
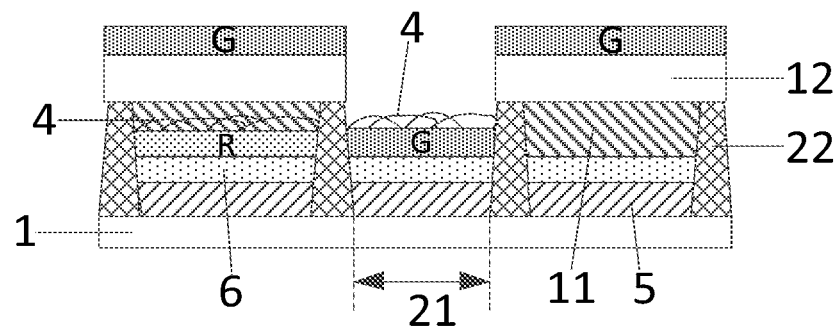
FIG. 13O is a schematic structural diagram after forming the polymer structure in a first target pixel opening during formation of green quantum dot and polymer structure thereof.
Figure 13P:
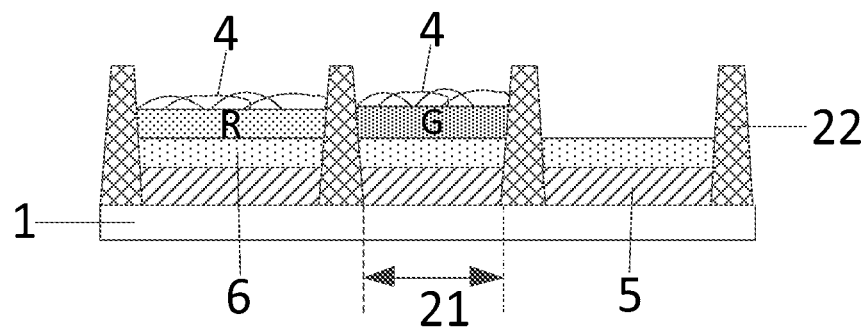
FIG. 13P is a schematic structural diagram after removing the sacrifice layer to form the monochromatic quantum dots in the first target pixel opening during formation of green quantum dot and polymer structure thereof.
Figure 13Q:
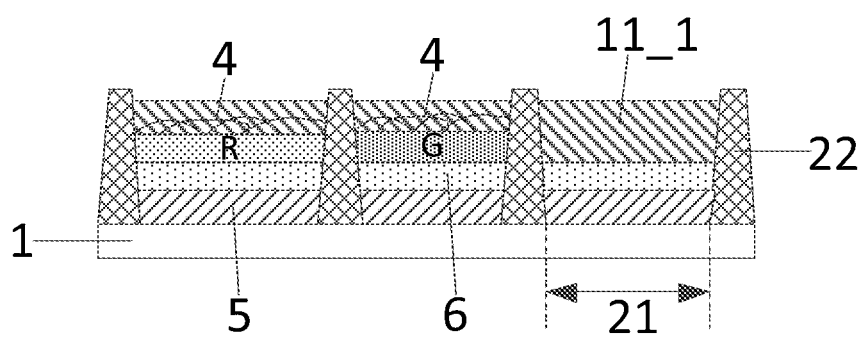
FIG. 13Q is a schematic structural diagram after spin-coating the electron transport layer with the sacrifice layer material film layer during formation of blue quantum dot and polymer structure thereof.
Figure 13R:
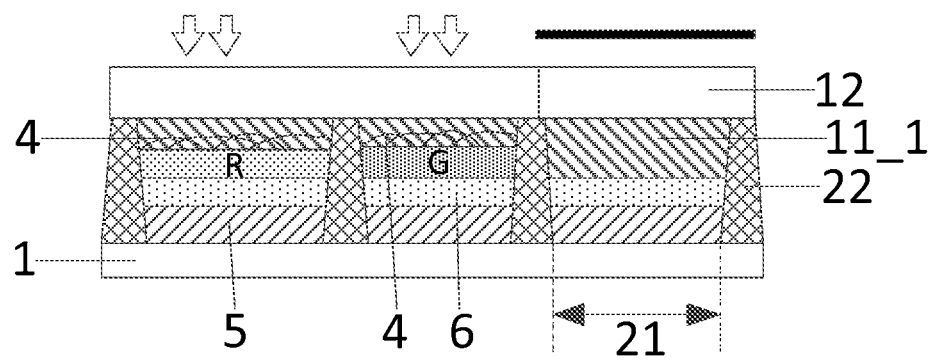
FIG. 13R is a schematic structural diagram after forming a photoresist layer on the electron transport layer during formation of blue quantum dot and polymer structure thereof.
Figure 13S:
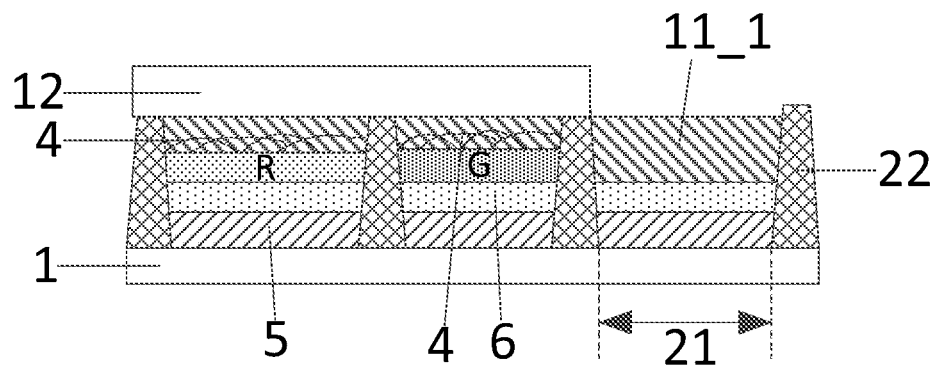
FIG. 13S is a schematic structural diagram after removing the photoresist material in the first target pixel opening during formation of blue quantum dot and polymer structure thereof.
Figure 13T:
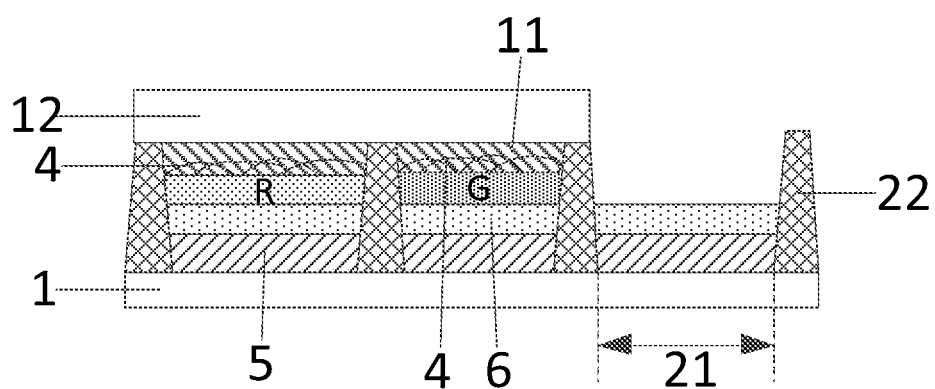
FIG. 13T is a schematic structural diagram after forming a sacrifice layer in a region outside the target pixel opening during formation of blue quantum dot and polymer structure thereof.
Figure 13U:
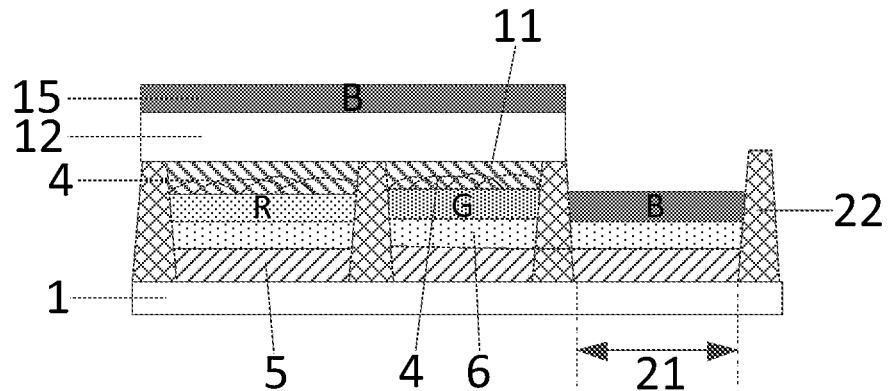
FIG. 13U is a schematic structural diagram after spin-coating the substrate of the sacrifice layer with the monochromatic quantum dot material during formation of blue quantum dot and polymer structure thereof.
Figure 13V:
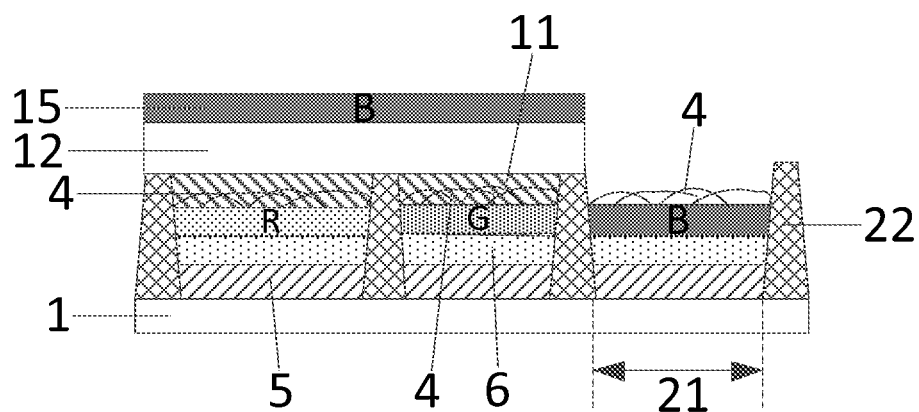
FIG. 13V is a schematic structural diagram after forming the polymer structure in a first target pixel opening during formation of blue quantum dot and polymer structure thereof.
Figure 13W:
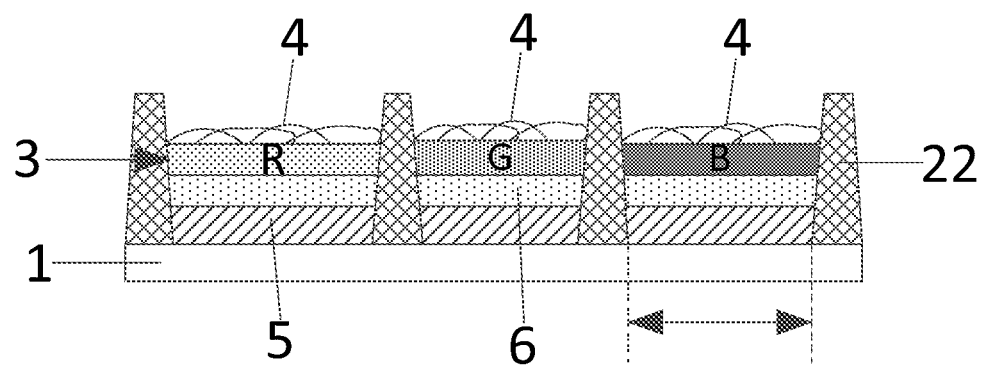
FIG. 13W is a schematic structural diagram after removing the sacrifice layer to form the monochromatic quantum dots in the first target pixel opening during formation of blue quantum dot and polymer structure thereof.

Optionally, as shown in FIG. 13W, the quantum dot layers 3 and the polymer structures 4 sealing the quantum dot layers 3 in the pixel openings 21 are sequentially formed in the pixel openings 21. Before forming the polymer structures 4, a surface of each pixel partition body 22 has a large number of hydroxide radicals; during the formation of the polymer structures 4, a part of the hydroxide radicals reacts with the siloxane; and after forming the polymer structures 4, the surface of each pixel partition body 22 has a certain quantity of hydroxide radicals.

Figure 9:
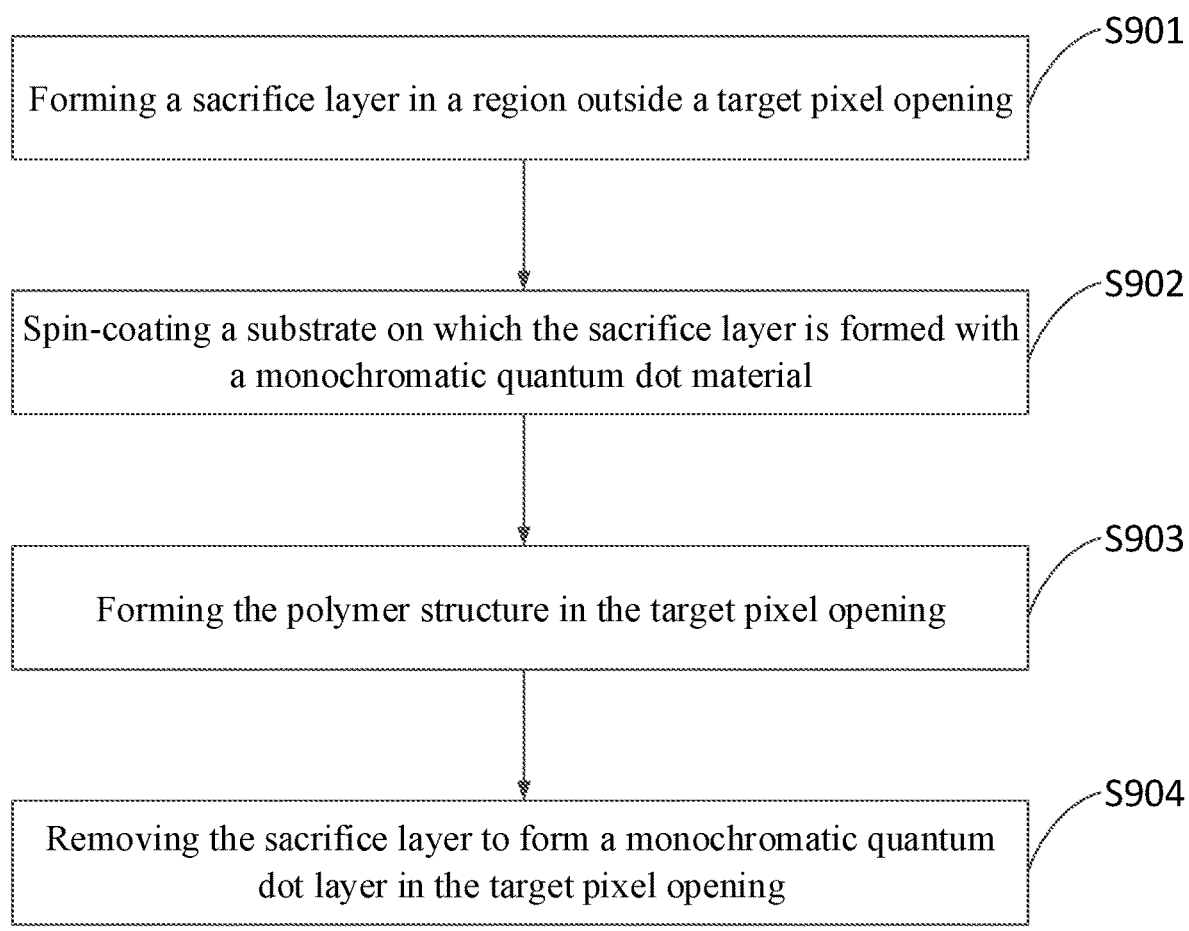
FIG. 9 is a second manufacturing method flow chart of a method for patterning a quantum dot layer provided by an embodiment of the present disclosure.

As shown in FIG. 9, a manufacturing method for forming each monochromatic quantum dot and the polymer structures includes followings.

S901, a sacrifice layer is formed in a region outside a target pixel opening.

Optionally, as shown in FIG. 13F, the sacrifice layer 11 is formed in the region (a region not marked with 21) outside the target pixel opening 21. For detailed process, reference may be made to a manufacturing process of following FIGS. 13B-13F.

S902, the substrate on which the sacrifice layer is formed is spin-coated with a monochromatic quantum dot material.

Optionally, as shown in FIG. 13G, the substrate 1 on which the sacrifice layer 11 is formed is spin-coated with the monochromatic quantum dot material, such as a red quantum dot R material. Optionally, the substrate 1 on which the sacrificial layer 11 is formed is spin-coated with a low-boiling-point solution (n-hexane, n-heptane, or n-octane) of the red quantum dot R, and a film is formed at room temperature or under heating (25-120° C.). A speed of a homogenizer is set to 500-2500 rpm to adjust a thickness of the red quantum dot R film.

Optionally, a surface of each quantum dot layer has defective sites or regions not covered by ligands, so as to chemically coordinate with an S atom introduced into each polymer structure. Oil-soluble cadmium-containing quantum dots, such as CdS/ZnS, CdSe/ZnS, CdSe/ZnSeS, and CdSe/CdS, as well as oil-soluble cadmium-free quantum dots, such as ZnSe/ZnS, InP/ZnS, CuInS/ZnS, (Zn)CuInS/ZnS, (Mn)CuInS/ZnS, AgInS/ZnS, (Zn)AgInS/ZnS, CuInSe/ZnS, and CuInSeS/ZnS, may be selected.

S903, a polymer structure is formed in a target pixel opening.

Optionally, as shown in FIG. 13H, the polymer structure 4 is formed in a first target pixel opening 21.

S904, the sacrifice layer is removed to form monochromatic quantum dots in the target pixel opening.

Optionally, as shown in FIG. 13I, the sacrifice layer 11 is removed to form the monochromatic quantum dots, i.e. red quantum dots R, in the first target pixel opening 21.

According to the manufacturing method of the quantum dot light emitting device provided by an embodiment of the present disclosure, the polymer structures sealing the quantum dot layers in the pixel openings are formed on the quantum dot layers, and the polymer structure are of the fully enclosed structures, so that the quantum dot layers can be protected against solvent damage during a subsequent photoresist development process, a film thickness of each quantum dot layer is kept unchanged, a quantum dot layer ligand is protected against loss, and device performance is improved.

Figure 10:
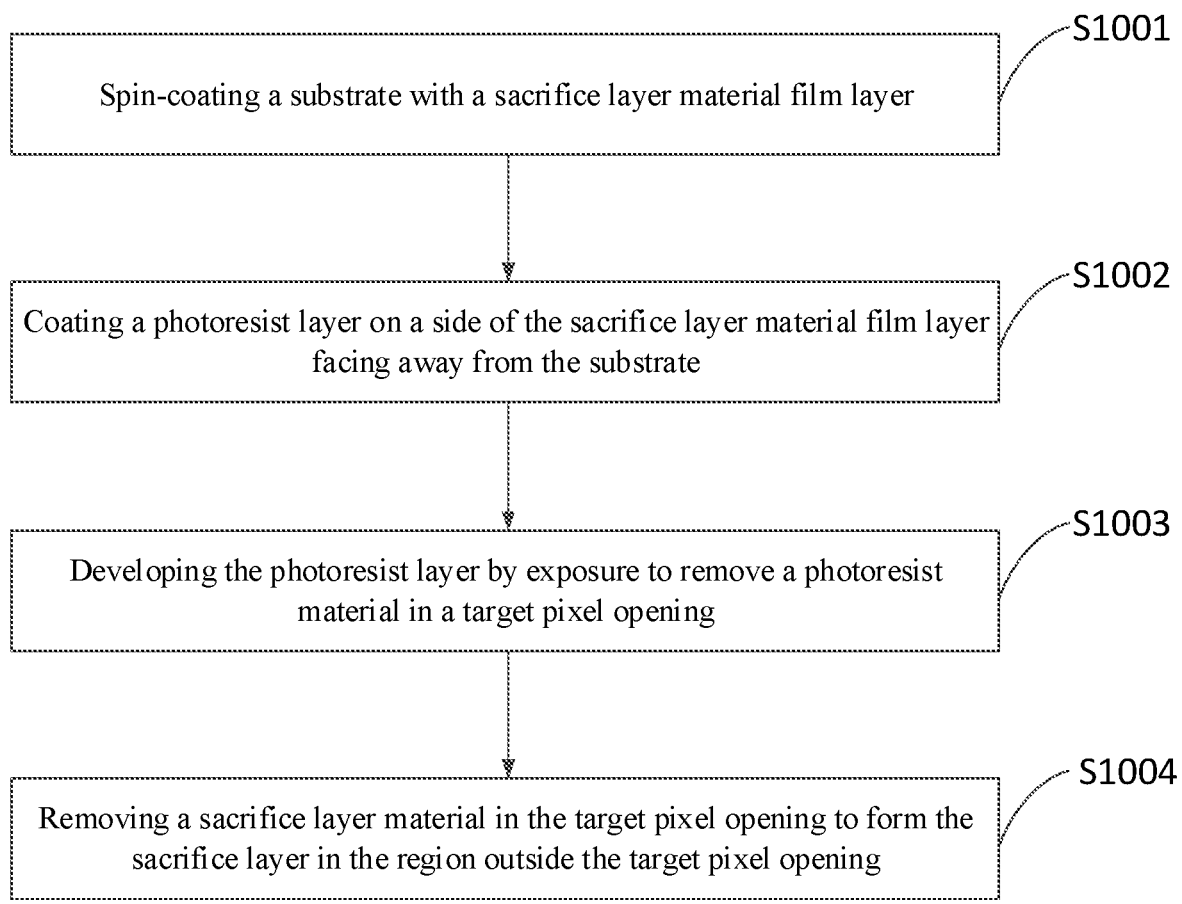
FIG. 10 is a third manufacturing method flow chart of a method for patterning a quantum dot layer provided by an embodiment of the present disclosure.

In specific implementation, in the manufacturing method provided by an embodiment of the present disclosure, as shown in FIG. 10, forming the sacrifice layer in the region outside the target pixel opening includes followings.

S1001, the substrate is spin-coated with a sacrifice layer material film layer.

Optionally, as shown in FIG. 13B, taking an inverted structure as an example, an electron transport layer 6 is formed in the pixel opening 21 of the substrate 1. The electron transport layer 6 may be a zinc oxide-based film or a zinc oxide-based nanoparticle layer.

(a) Preparation of the Zinc Oxide-Based Film:

2 g of zinc acetate (or zinc nitrate, etc.) is dissolved in 10 mL of a mixed solution of ethanolamine and n-butanol. The substrate 1 is placed in a homogenizer, and 90-120 UL of a zinc precursor solution is dropped onto the substrate, and a film is formed by spin-coating. The substrate 1 is placed on a hot table at 250-300° C., a concurrent solvent is heated, and a zinc oxide film layer (ie, the electron transport layer 6) is finally introduced on the substrate 1.

(b) Preparation of the Zinc Oxide-Based Nanoparticle Layer:

an alcohol solution of zinc oxide nanoparticles (or other zinc oxide nanoparticles doped with magnesium, aluminum, gallium, or rare earth ion lanthanum, or samarium) is dropped onto the substrate 1, and a film is formed by spin-coating and is dried at 80-120° C. By controlling a rotation speed of a spin-coater (500-2500 rpm) and a concentration of a zinc precursor solution, a thickness of the zinc oxide film layer is controlled to be 30-80 nm to form the zinc oxide-based nanoparticle layer (i.e., the electron transport layer 6).

Next, as shown in FIG. 13C, the electron transport layer 6 is spin-coated with the sacrifice layer material film layer 11_1; the spin-coated sacrificial layer material film layer 11_1 is optionally: an alcohol solution 50 mg/mL polyvinylpyrrolidone (with molecular weight between 5000-5000) is prepared and dropped onto the above-mentioned electron transport layer 6, and a film is formed by spin-coating and is dried at 80-120° C. to form the sacrifice layer material film layer 11_1. A thickness of the sacrifice layer material film layer 11_1 is controlled within 100-500 nm.

S1002, a photoresist layer is coated on a side of the sacrifice layer material film layer facing away from the substrate.

Optionally, as shown in FIG. 13D, taking a negative photoresist as an example, the negative photoresist is dropped onto the sacrifice layer material film layer 11_1, and by controlling the rotation speed of the spin coater and a concentration of the negative photoresist, a thickness of a negative photoresist film layer is controlled to form a photoresist layer 12.

S1003, the photoresist layer is subjected to exposure developing to remove a photoresist material in a target pixel opening.

Optionally, as shown in FIG. 13D, a mask and the substrate 1 are aligned and adjusted, the mask is adopted to block a first target pixel opening 21 on the substrate 1, and a region not marked with 21 is exposed, that is, the photoresist layer 12 is subjected to exposure developing. A black region above the photoresist layer 12 is a shading area, and a arrow is an exposure region. The exposed structure in FIG. 13D is placed in a paraxylene solution and soaked for 30-180 s to remove the photoresist in the first target pixel opening 21. As shown in FIG. 13E, the photoresist layer 12 in the exposure region is remained, the photoresist material in the first target pixel opening 21 is removed, and the sacrifice layer material film layer 11_1 in the first target pixel opening 21 is exposed.

S1004, a sacrifice layer material in the target pixel opening is removed to form the sacrifice layer in the region outside the target pixel opening.

Optionally, as shown in FIG. 13F, the structure in FIG. 13E is placed in an ICP (Inductively Coupled Plasma), oxygen or argon are adopted, and etching is performed for 30-200 s to remove the sacrifice layer material 11_1 in the first target pixel opening 21, so as to form the sacrificed layer 11 in the region outside the first target pixel opening 21.

Figure 11:
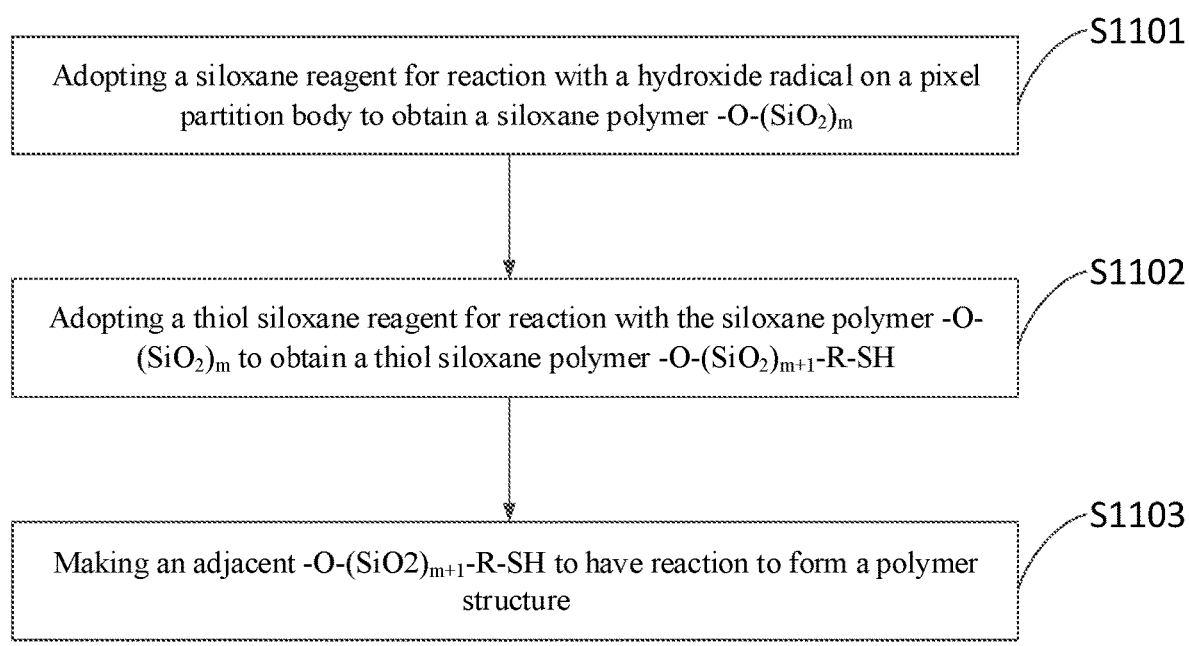
FIG. 11 is a fourth manufacturing method flow chart of a method for patterning a quantum dot layer provided by an embodiment of the present disclosure.

In specific implementation, in the manufacturing method provided by an embodiment of the present disclosure, as shown in FIG. 11, forming the polymer structure in the target pixel opening includes:

S1101, a siloxane reagent is adopted for reaction with the hydroxide radical on each pixel partition body to obtain a siloxane polymer —O—$(SiO_2)_m$.

Optionally, a siloxane reagent may be selected from tetraethyl orthosilicate, methyl orthosilicate, ethyl orthosilicate, diphenyldimethoxysilane, hexadecyltrimethoxysilane, isobutyl Triethoxy silane, isobutyl trimethoxy silane, dimethyl dimethoxy silane, methyl ketoxime silane, methyl triacetoxy silane, propyl triethoxy isocyanate Silicon, phenyltrimethoxysilane, phenyltriethoxysilane, octyltrimethoxysilane, n-octyltriethoxysilane, dodecyltriethoxysilane, dodecyltrimethoxysilane ailane, vinyl tributyl ketoxime silane, etc.

Taking the siloxane reagent being the tetraethyl orthosilicate as an example, an ethanol solution of 0.05-0.1 mol/mL tetraethyl orthosilicate (for example, 0.05 mL of ethyl orthosilicate, 4.05 mL of ethanol) is prepared, a small amount of ammonia (0.1 mL) is added, 90 μL of the above solution is dropped to a device in FIG. 13G, and a film is formed by spin-coating at a rotation speed of 1000-4000 rpm and is placed at room temperature for 1-2 h. Then the above-mentioned substrate 1 is rinsed with ultra-dry absolute ethanol for 2-3 times. This step may be completed in the air, which may get rid of the dependence on an expensive glove box. As shown in FIG. 5B, the tetraethyl orthosilicate reacts with the hydroxyl radical —OH on each pixel partition body 22 around the first target pixel opening 21 to obtain a siloxane polymer —O—$(SiO_2)_m$; and optionally, a thickness of the siloxane polymer may be controlled by controlling a concentration of the siloxane reagent and a rotation speed of spin-coating, generally within 0.413-10 nm (a thickness of a $SiO_2$ monolayer is 0.413 nm, a diameter of a silicon atom is 0.117 nm, and a diameter of an oxygen atom is 0.148 nm). Therefore, the value of m is preferably 1-25.

S1102, a thiol siloxane reagent is adopted for reaction with the siloxane polymer —O—$(SiO_2)_m$ to obtain a thiol siloxane polymer —O—$(SiO_2)_{m+1}$—R—SH, where R is an alkyl radical.

Optionally, the thiol siloxane reagent may be selected from:

3-mercaptopropyltrimethoxysilane, 3-mercaptopropyltriethoxysilane, 3-mercaptopropylmethyldimethoxysilane, 3-mercapto propylmethyldiethoxysilane, mercaptopropylsilane, 3-mercaptopropyltrimethylsilane, bis-[3-(triethoxysilyl)propyl]-tetrasulfide and other thiol-containing silanes.

Optionally, an anhydrous ethanol solution of 0.05-0.1 mol/mL thiol siloxane is prepared and dropped to the structure in FIG. 5B, or the structure in FIG. 5B is immersed the in anhydrous ethanol solution of thiol siloxane for a certain period of time, finally the reagent at the bottom is dried, and the structure is placed at room temperature for 1-2 h. As shown in FIG. 5C, the thiol siloxane reagent reacts with the siloxane polymer —O—$(SiO_2)_m$. A sulfur atom of a thiol in the thiol siloxane is combined with a coordinating atom (such as Zn, Cd, Pb, etc.) of the quantum dot layer to obtain the thiol siloxane polymer-O—$(SiO_2)_{m+1}$—R—SH.

S1103, an adjacent —O—$(SiO_2)_{m+1}$—R—SH has reaction to form the polymer structure.

Optionally, the polymer structures as shown in FIG. 13H are formed, and on the basis of FIG. 5C, as shown in FIGS. 5D and 5E, the adjacent —O—$(SiO_2)_{m+1}$—R—SH has reaction to form the polymer structures. Details are given in a reaction process of FIGS. 5D and 5E.

Optionally, in the manufacturing method provided by an embodiment of the present disclosure, making the adjacent —O—$(SiO_2)_{m+1}$—R—SH to have the reaction to form the polymer structures includes followings.

As shown in FIG. 5D, —SH in the adjacent —O$(SiO_2)_{m+1}$—R—SH on each pixel partition body 22 around the first target pixel opening 21 has disulfide reaction, i.e. a —SH functional group has dehydrogenation reaction, and the polymer structures —O—$(SiO_2)_{m+1}$—R—S—S—R—$(SiO_2)_{m+1}$—O— are formed.

Optionally, R may be methyl, ethyl, propyl, pentyl, hexyl, octyl, nonyl, dodecyl, or tetradecyl.

In specific implementation, in the manufacturing method provided by an embodiment of the present disclosure, making the adjacent —$O(SiO_2)_{m+1}$—R—SH to have the reaction to form the polymer structures includes followings.

As shown in FIG. 5E, an $R_1CH$=$CHR_2$ olefin compound (which may be a carbon-carbon double bond or a derivative of a carbon-carbon double bond structure) is introduced on each pixel partition body 22 around the first target pixel opening 21, the adjacent —O—$(SiO_2)_{m+1}$—R—SH has addition reaction with $R_1CH$=$CHR_2$ to form the polymer structures —O—$(SiO_2)_{m+1}$—R—S—S—R—$(SiO_2)_{m+1}$—O—.

In specific implementation, in the manufacturing method provided by an embodiment of the present disclosure, as shown in FIG. 5E, R1 and R2 may be respectively selected from one or more of polyphenylene, polythiophene, polyfluorene, polytriphenylamine, polycarbazole, polypyrrole, and polyporphyrin, and R1 and R2 are identical or different.

Optionally, an "organic hole transport layer/quantum dot/ inorganic electron transport layer" hybrid QLED device structure that is commonly adopted at present has the problems of insufficient hole transport ability injection and imbalance of electrons and holes. In the embodiment of the present disclosure, the insufficient hole transport ability may also be realized by R1 and R2 groups in the polymer structures 4 in FIG. 5E. The R1 and R2 groups may be selected from functional groups such as polyphenylene, polythiophene, polyfluorene, polytriphenylamine, polycarbazole, polypyrrole, and polyporphyrin. These functional groups have hole transport ability, and form a new hole transport path with the quantum dot layers 3 to improve the hole transport ability and regulate the balance of carrier injection.

Figure 12:
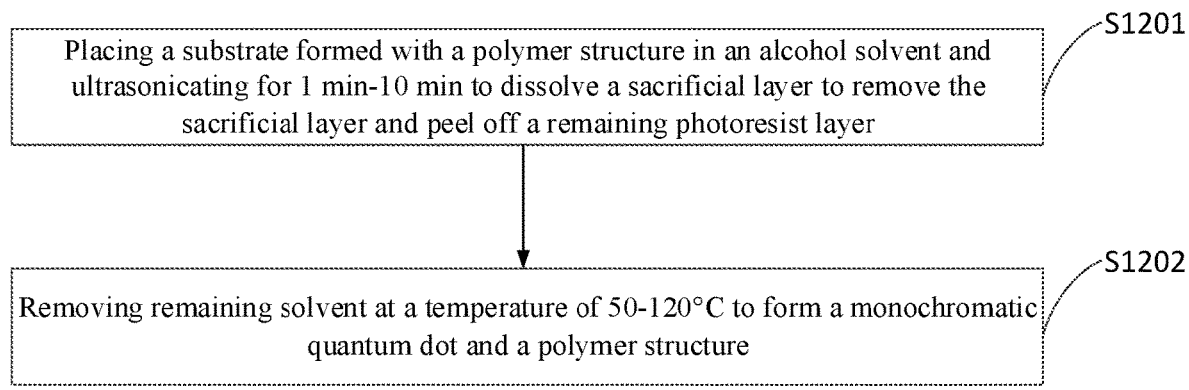
FIG. 12 is a fourth manufacturing method flow chart of a method for patterning a quantum dot layer provided by an embodiment of the present disclosure.

In specific implementation, in the manufacturing method provided by an embodiment of the present disclosure, as shown in FIG. 12, removing the sacrifice layer to form a monochromatic quantum dot layer in the target pixel opening may include followings.

S1201, the substrate formed with the polymer structures is placed in an alcohol solvent and ultrasonicating for 1 min-10 min to dissolve the sacrificial layer to remove the sacrificial layer and peel off the remaining photoresist layer.

Optionally, at step S904, for removing the sacrifice layer 11, the substrate 1 formed with the polymer structures 4 (FIG. 13H) is placed in the alcohol solvent and ultrasonicating for 1 min-10 min to dissolve the sacrificial layer 11, i.e. to dissolve macromolecules outside the first target pixel opening 21 (not marked with 21), and to peel off the photoresist 12 on an upper layer of the sacrificial layer 11.

S1202, the remaining solvent is removed at a temperature of 50-120° C. to form a monochromatic quantum dot and the polymer structures.

Optionally, the device obtained in step S1201 is placed on a hot table at 50-120° C., a concurrent solvent is heated, the remaining solvent is removed, and the red quantum dots R are formed in the first target pixel opening 21 on the substrate 1, i.e. a structure in FIG. 13I is obtained.

Therefore, through the steps for forming FIGS. 13A-13I, the polymer structures 4 sealing the red quantum dots R in the first target pixel opening 21 may be formed in the first target pixel opening 21 on the substrate 1.

In specific implementation, after forming the red quantum dots R and the polymer structures 4 in the first target pixel opening 21, the green quantum dots G, the blue quantum dots B, and their corresponding polymer structures need to be formed.

The green quantum dots G and corresponding polymer structures are formed on a basis of FIG. 13I. For detailed steps, reference may be made to the process of forming the red quantum dots R and the corresponding polymer structures, i.e. steps in FIGS. 13C-13I. A difference between the formation of the green quantum dots G and their corresponding polymer structures 4 and the formation of the red quantum dots R and their corresponding polymer structures 4 is that when a quantum dot solution is spin-coated, a green quantum dot G solution is spin-coated, and the rest of the production process is exactly the same. The schematic diagrams of forming the green quantum dots G and the corresponding polymer structures 4 are shown in FIGS. 13J-13P, FIG. 13J corresponds to FIG. 13C, FIG. 13K corresponds to FIG. 13D, FIG. 13L corresponds to FIG. 13E, FIG. 13M corresponds to FIG. 13F, FIG. 13N corresponds to FIG. 13G, FIG. 13O corresponds to FIG. 13H, and FIG. 13P corresponds to FIG. 13I.

The blue quantum dots B and corresponding polymer structures 4 are formed on a basis of FIG. 13P. For detailed steps, reference may be made to the process of forming the red quantum dots R and the corresponding polymer structures, i.e. steps in FIGS. 13C-13I. A difference between the formation of the blue quantum dots B and their corresponding polymer structures 4 and the formation of the red quantum dots R and their corresponding polymer structures 4 is that when a quantum dot solution is spin-coated, a blue quantum dot B solution is spin-coated, and the rest of the production process is exactly the same. The schematic diagrams of forming the blue quantum dots B and the corresponding polymer structures 4 are shown in FIGS. 13Q-13W, FIG. 13Q corresponds to FIG. 13C, FIG. 13R corresponds to FIG. 13D, FIG. 13S corresponds to FIG. 13E, FIG. 13T corresponds to FIG. 13F, FIG. 13U corresponds to FIG. 13G, FIG. 13V corresponds to FIG. 13H, and FIG. 13W corresponds to FIG. 13I.

In summary, according to embodiments of the present disclosure, the structure of FIG. 1 or FIG. 2 may be obtained through the manufacturing process of FIGS. 13A-13W. That is, a fully enclosed polymer structure 4 is formed on each quantum dot layer 3, so that the quantum dot layers 3 can be protected against solvent damage during a subsequent photoresist development process, a film thickness of each quantum dot layer 3 is kept unchanged, a quantum dot layer ligand is protected against loss, and device performance is improved.

After forming the structure of FIG. 1 or FIG. 2, the quantum dot light emitting device further includes forming: a hole transport layer 7, a hole injection layer 8 and an anode 9.

Figure 14:
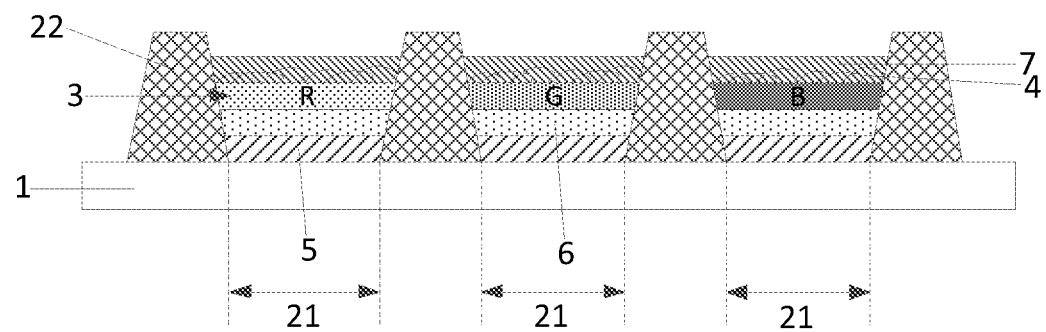
FIG. 14 is a schematic structural diagram of another quantum dot light emitting device provided by an embodiment of the present disclosure.

A manufacturing process of the hole transport layer 7: the hole transport layer 7 is manufactured on the structure of FIG. 13W, as shown in FIG. 14. A material of the hole transport layer 7 may be the commonly used TFB (poly(9, 9-dioctylfluorene-CO—N-(4-butylphenyl) diphenylamine)), or other commercially available compounds with hole transport. Optionally, the TFB is spin-coated into a film and heated in an inert gas at 130-150° C. A thickness of the hole transport layer 7 may be adjusted according to the speed of the homogenizer.

Figure 15:
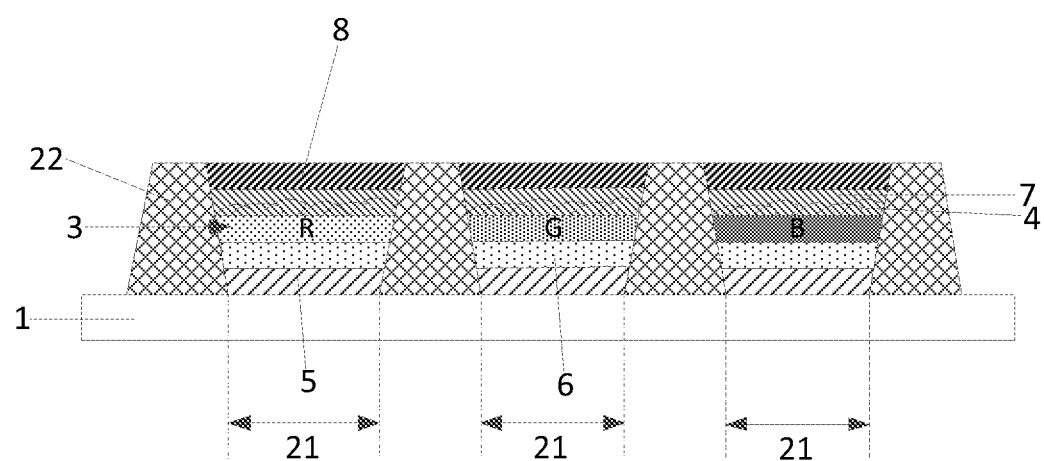
FIG. 15 is a schematic structural diagram of another quantum dot light emitting device provided by an embodiment of the present disclosure.

A manufacturing process of the hole injection layer 8: the hole injection layer 8 is manufactured on the structure of FIG. 14, as shown in FIG. 15. A material of the hole injection layer 8 may be selected from PEDOT:PSS (poly(3,4-ethylenedioxythiophene)-polystyrene sulfonic acid), or other commercially available compounds with hole injection. The PEDOT is spin-coated into a film and heated in an inert gas at 130-150° C. A thickness of the hole injection layer 8 may be adjusted according to the speed of the homogenizer.

A manufacturing process of the anode 9: the anode 9 is manufactured on the structure of FIG. 15 as shown in FIG. 7. A material of the anode 9 may be Al, Ag, Au, IZO, or the like. Optionally, Al, Ag or Au may be formed by evaporation, and IZO may be formed by sputtering.

After the device structure shown in FIG. 7 is obtained, the structure of FIG. 7 is packaged. Optionally, a package cover plate is covered, and the structure is packaged with ultraviolet curing glue to complete the preparation of the QLED device.

Based on the same inventive concept, an embodiment of the present disclosure further provides a display apparatus, including the above-mentioned quantum dot light emitting device provided by embodiments of the present disclosure.

In specific implementation, the above-mentioned display apparatus provided by an embodiment of the present disclosure may be any product or component with a display function, such as a mobile phone, a tablet computer, a television, a monitor, a notebook computer, a digital photo frame, a navigator, and the like. Other indispensable components of the display apparatus should be understood by those of ordinary skill in the art, will not be repeated here, and should not be used as a limitation to the present disclosure. The implementation of the display apparatus may be referred to the embodiment of the above-mentioned quantum dot light emitting device, and repetition will not be made.

In specific implementation, the display apparatus provided by an embodiment of the present disclosure may also include other functional film layers well known to those of skill in the art, which will not be described in detail here.

A quantum dot light emitting device and a manufacturing method thereof as well as a display apparatus provided by embodiments of the present disclosure include: a substrate; a pixel definition layer, wherein the pixel definition layer includes a plurality of pixel openings and pixel partition bodies, and a surface of each pixel partition body has a hydroxide radical; quantum dot layers, located in the pixel openings; and polymer structures, sealing the quantum dot layers in the pixel openings, wherein each polymer structure is of a fully enclosed structure at least formed by polymerization of siloxane, thiol siloxane and the hydroxide radical, the siloxane, the hydroxide radical and the thiol siloxane are all polymerized, and a sulfur atom of a thiol in the thiol siloxane is combined with a coordinating atom of each quantum dot layer. According to the present disclosure, the polymer structures sealing the quantum dot layers in the pixel openings are formed on the quantum dot layers, and the polymer structures are of the fully enclosed structures, so that the quantum dot layers can be protected against solvent damage during a subsequent photoresist development process, a film thickness of each quantum dot layer is kept unchanged, a quantum dot layer ligand is protected against loss, and device performance is improved.

Apparently, those of skill in the art can make various changes and modifications to the present disclosure without departing from the spirit and scope of the present disclosure. In this way, if these modifications and variations of the present disclosure fall within the scope of the claims of the present disclosure and their equivalent technologies, the present disclosure is also intended to include these modifications and variations.

What is claimed is:

1. A quantum dot light emitting device, comprising:
a substrate;
a pixel definition layer arranged on the substrate, wherein the pixel definition layer comprises a plurality of pixel openings and pixel partition bodies, the pixel partition bodies define each of the plurality of pixel openings, and a surface of the pixel partition bodies has a hydroxide radical;
a quantum dot layer arranged in each of the pixel openings; and
a polymer structure sealing the quantum dot layer in each of the pixel openings, wherein each polymer structure is of a fully enclosed structure at least formed by polymerization of siloxane, thiol siloxane and the hydroxide radical, the siloxane, the hydroxide radical and the thiol siloxane are all polymerized, and a sulfur atom of a thiol in the thiol siloxane is combined with a coordinating atom of the quantum dot layer.

2. The quantum dot light emitting device according to claim 1, wherein the thiol in the thiol siloxane has disulfide reaction to form the polymer structure, and the polymer structure is —O—$(SiO_2)_{m+1}$—R—S—S—R—$(SiO_2)_{m+1}$—O—, wherein R is an alkyl radical, m is a positive integer.

3. The quantum dot light emitting device according to claim 2, wherein m is 1-25.

4. The quantum dot light emitting device according to claim 1, wherein the thiol in the thiol siloxane has addition reaction with an olefin to form the polymer structure, and the polymer structure is —O—$(SiO_2)_{m+1}$—R—S—$CR_1$—$CR_2$—S—R—$(SiO_2)_{m+1}$—O—, wherein
R is an alkyl radical, R1 and R2 are respectively selected from one or more of polyphenylene, polythiophene, polyfluorene, polytriphenylamine, polycarbazole, polypyrrole, and polyporphyrin, and R1 and R2 are identical or different, m is a positive integer.

5. The quantum dot light emitting device according to claim 4, wherein m is 1-25.

6. The quantum dot light emitting device according to claim 1, wherein the quantum dot layer comprises a red quantum dot, a blue quantum dot and a green quantum dot, and a surface of each of the red quantum dot, the blue quantum dot and the green quantum dot has a corresponding polymer structure.

7. The quantum dot light emitting device according to claim 1, further comprises: a cathode located between the substrate and the quantum dot layer, an electron transport layer arranged between the cathode and the quantum dot layer, a hole transport layer arranged on a side of the polymer structure facing away from the substrate, a hole injection layer arranged on a side of the hole transport layer facing away from the substrate, and an anode located on a side of the hole injection layer facing away from the substrate.

8. A display apparatus, comprises the quantum dot light emitting device according to claim 1.

* * * * *